(12) United States Patent
Yamashita et al.

(10) Patent No.: US 8,659,584 B2
(45) Date of Patent: *Feb. 25, 2014

(54) DISPLAY APPARATUS, METHOD OF DRIVING A DISPLAY, AND ELECTRONIC DEVICE

(71) Applicant: Sony Corporation, Tokyo (JP)

(72) Inventors: Junichi Yamashita, Tokyo (JP); Masatsugu Tomida, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/717,013

(22) Filed: Dec. 17, 2012

(65) Prior Publication Data

US 2013/0127802 A1    May 23, 2013

Related U.S. Application Data

(63) Continuation of application No. 13/354,908, filed on Jan. 20, 2012, now Pat. No. 8,362,982, which is a continuation of application No. 13/137,092, filed on Jul. 20, 2011, now Pat. No. 8,130,178, which is a continuation of application No. 12/927,000, filed on Dec. 22, 2010, now Pat. No. 8,026,874, which is a continuation of application No. 12/071,284, filed on Feb. 19, 2008, now Pat. No. 7,880,695.

(30) Foreign Application Priority Data

Feb. 21, 2007   (JP) ................................ 2007-041196

(51) Int. Cl.
*G06F 3/038* (2013.01)
*G09G 5/00* (2006.01)

(52) U.S. Cl.
USPC ........................................... 345/205; 345/80

(58) Field of Classification Search
USPC ............. 345/76–80, 90, 92; 315/169.1–169.3
See application file for complete search history.

(56) References Cited

U.S. PATENT DOCUMENTS 7,764,251 B2   7/2010   Yamashita et al.
2008/0062096 A1   3/2008   Yamashita et al.

FOREIGN PATENT DOCUMENTS

| JP | 2003-043995 | | 2/2003 |
|---|---|---|---|
| JP | 2003-255856 | A | 9/2003 |
| JP | 2003-271095 | A | 9/2003 |
| JP | 2004-029791 | A | 1/2004 |
| JP | 2004-093682 | A | 3/2004 |
| JP | 2004-133240 | A | 4/2004 |
| JP | 2004-354428 | | 12/2004 |
| JP | 2006-058909 | | 3/2006 |
| JP | 2006-215213 | | 8/2006 |
| JP | 2007-034001 | | 2/2007 |

OTHER PUBLICATIONS

Japanese Office Action issued Dec. 16, 2008 for corresponding Japanese Application No. 2007-041196.

*Primary Examiner* — Ricardo L Osorio
(74) *Attorney, Agent, or Firm* — Rader, Fishman & Grauer PLLC

(57) ABSTRACT

In a display apparatus including a switching transistor, a correction voltage for eliminating an effect of a variation in a characteristic of a driving transistor is stored in a storage capacitor. The switching transistor is disposed between one current terminal of the driving transistor and a light emitting element. The switching transistor turns off during the non-light emission period thereby to electrically disconnect the light emitting element from the one current terminal of the driving transistor thereby preventing a leakage current from flowing through the light emitting element during the period in which the correction unit operates, and thus preventing the correction voltage from having an error due to the leakage current.

22 Claims, 22 Drawing Sheets

DISPLAY APPARATUS, METHOD OF DRIVING A DISPLAY, AND ELECTRONIC DEVICE

CROSS-REFERENCES TO RELATED APPLICATIONS

This is a Continuation application of U.S. patent application Ser. No. 13/354,908, filed Jan. 20, 2012, which is a Continuation application of U.S. patent application Ser. No. 13/137,092, filed Jul. 20, 2011, which is a Continuation application of U.S. patent application Ser. No. 12/927,000, filed Dec. 22, 2010, now U.S. Pat. No. 8,026,874, issued Sep. 27, 2011, which is a Continuation application of U.S. patent application Ser. No. 12/071,284, filed Feb. 19, 2008, now U.S. Pat. No. 7,880,695, issued Feb. 1, 2011, which in turn claims priority from Japanese Patent Application JP 2007-041196, filed in the Japanese Patent Office on Feb. 21, 2007, the entire contents of which are incorporated herein by reference.

BACKGROUND OF THE INVENTION

1. Field of the Invention

The present invention relates to a display apparatus including an array of pixels each including a light emitting element, and more particularly, to an active matrix display apparatus adapted to control currents flowing through light emitting elements, for example, of the organic electroluminescent type by using insulating gate field effect transistors disposed in the respective pixels. The present invention also relates to a method of driving such a display apparatus and to an electronic device using such a display apparatus.

2. Description of the Related Art

In an image display apparatus such as a liquid crystal display, a large number of liquid crystal pixels are arranged in the form of a matrix and the intensity of light transmitting through or reflected from the respective pixels are controlled in accordance with image information thereby displaying an image. Organic electroluminescent elements may be used as light emitting elements disposed in the respective pixels. In contrast to liquid crystal pixels which are not of the self-luminous type, the organic electroluminescent display is of the self-luminous type and has the following advantages. That is, the organic electroluminescent display provides high visibility compared with the liquid crystal display, does not need backlighting, and can respond at a high speed. The intensity levels (gray-scale levels) of each light emitting element can be controlled by controlling the current flowing through the light emitting element. That is, the organic electroluminescent display device is of the current-controlled type. In this respect, the organic electroluminescent device is very different from the liquid crystal display which is of the voltage-controlled type.

As with the liquid crystal display, the organic electroluminescent display can be driven by a passive matrix addressing scheme or an active matrix addressing scheme. Although the passive matrix address scheme needs a simpler configuration, the disadvantage of this scheme is that it is difficult to realize a large-size high-resolution display. For the above reason, the active matrix address scheme is currently receiving more attention. In this scheme, the current flowing through the light emitting element disposed in each pixel is controlled by an active element (for example, a thin-film transistor (TFT)) disposed in each pixel. Further detailed descriptions of this scheme and associated techniques may be found, for example, in patent documents listed below.

Japanese Unexamined Patent Application Publication No. 2003-255856
Japanese Unexamined Patent Application Publication No. 2003-271095
Japanese Unexamined Patent Application Publication No. 2004-133240
Japanese Unexamined Patent Application Publication No. 2004-029791
Japanese Unexamined Patent Application Publication No. 2004-093682
Japanese Unexamined Patent Application Publication No. 2006-215213

SUMMARY OF THE INVENTION

For example, pixel circuits are disposed at respective intersections of scanning lines in the form of rows for supplying control signals and signal lines in the form of columns for supplying an image signal, and each pixel circuit includes, at least, a sampling transistor, a storage capacitor, a driving transistor, and a light emitting element. The sampling transistor turns on in response to the control signal supplied via the scanning line and samples the image signal supplied via the signal line. The storage capacitor stores an input voltage (signal voltage) corresponding to the sampled image signal. The driving transistor supplies an output current during a predetermined light emission period in accordance with the input voltage stored in the storage capacitor. In general, the output current depends on the carrier mobility of the channel region of the driving transistor and also depends on the threshold voltage. The light emitting element is driven by the output current of the driving transistor so as to emit light with an intensity corresponding to the image signal.

The input voltage applied to the gate from the storage capacitor causes an output current to flow between the source and drain of the driving transistor, and the output current is supplied to the light emitting element. In general, the intensity of light emitted by the light emitting element varies in proportion to the current flowing therethrough. The output current of the driving transistor is controlled by the gate voltage given by the input voltage written in the storage capacitor. In the pixel circuit according to the related technique, the current supplied to the light emitting element is controlled by changing the input voltage applied to the gate of the driving transistor in accordance with the input image signal.

The operating characteristic of the driving transistor can be expressed by a characteristic equation shown below.

$$Ids=(1/2)W/L)Cox(Vgs-Vth)^2$$

In the transistor characteristic equation shown above, Ids is the drain current flowing between the source and drain, which is supplied, as the output current, to the light emitting element in the pixel circuit. Vgs is the gate voltage applied to the gate with respect to the source. In the pixel circuit, Vgs is given as the input voltage as described above. Vth is the threshold voltage of the transistor, and μ is the mobility of a semiconductor thin film forming the channel of the transistor. W, L, and Cox denote the channel width, the channel length, and the gate capacitance. As can be seen from the transistor characteristic equation, when the thin film transistor operates in the saturation region, if the gate voltage Vgs increases beyond the threshold voltage Vth, the transistor turns on and a drain current Ids flows. Theoretically, as can be seen from the transistor characteristic equation, if the gate voltage Vgs is constant, a constant drain current Ids is supplied to the light emitting element. Therefore, ideally, if an image signal with an equal signal level is supplied to all pixels of a screen, all pixels will emit light with an equal intensity, and thus a perfect uniformity in brightness will be obtained over the whole screen area.

However, in practice, thin film transistors (TFTs) formed using a semiconductor thin film, such as a polysilicon thin film, vary in device characteristics from one transistor to another. In particular, the threshold voltage Vth varies from pixel to pixel. As can be seen from the transistor characteristic equation described above, the variation in the threshold voltage Vth of driving transistors leads to a variation in the drain current Ids even if the gate voltage Vgs is equal, and thus a variation occurs in brightness from one pixel to another. This makes it difficult to achieve perfect uniformity in brightness over the screen. In view of the above, it is known to configure the pixel circuit to have a function of eliminating effects of the variation in the threshold voltage of the driving transistor (for example, see Japanese Unexamined Patent Application Publication No. 2004-133240).

By configuring the pixel circuit so as to have the function of eliminating the effects of the variation in the threshold voltage, it is possible to improve the uniformity in brightness over the screen. However, of various parameters of the characteristics of the polysilicon thin film transistor, not only the threshold voltage but also the mobility $\mu$ varies from one transistor to another. As can be seen from the transistor characteristic equation described above, the variation in mobility $\mu$ can lead to a variation in the drain current Ids even if the gate voltage Vgs is equal. As a result, the intensity of emitted light varies from one pixel to another, and thus degradation occurs in uniformity of brightness over the screen. There is a technique to configure the pixel circuit so as to have a function of eliminating the effects of the variation in mobility in addition to that in threshold voltage of the driving transistor (for example, see Japanese Unexamined Patent Application Publication No. 2006-215213).

The threshold voltage correction mechanism or the mobility correction mechanism implemented in each pixel circuit generally operates to perform a predetermined correction process during a period (non-light emission period) in which no light is emitted by the light emitting element. Even in the non-light emission period, a leakage current can occur in the light emitting element. The leakage current varies from one light emitting element disposed in a pixel to another. Because the leakage current occurs in the no-light emission period, the leakage current has an adverse effect on the accuracy of the correction operation. In particular, the variation in the leakage current of the light emitting element from one pixel to another leads to a variation in accuracy of the correction operation, and thus to a variation in the intensity of emitted light from pixel to pixel. As a result, degradation occurs in uniformity of brightness over the screen.

SUMMARY OF THE INVENTION

In view of the above, it is desirable to provide a display apparatus capable of accurately correcting light intensity regardless of leakage currents of light emitting elements.

According to one embodiment, a display apparatus includes a switching transistor, and a correction voltage for eliminating an effect of a variation in a characteristic of a driving transistor is stored in a storage capacitor. The switching transistor is disposed between one current terminal of the driving transistor and a light emitting element. The switching transistor turns off during the non-light emission period thereby to electrically disconnect the light emitting element from the one current terminal of the driving transistor thereby preventing a leakage current from flowing through the light emitting element during the period in which the correction unit operates, and thus preventing the correction voltage from having an error due to the leakage current.

According to another embodiment, there is provided a display apparatus including a pixel array and a driving unit adapted to drive the pixel array, the pixel array including scanning lines disposed in the form of rows, signal lines disposed in the form of columns, and pixels disposed, in the form of an array, at respective intersections of the scanning lines and the signal lines, each pixel including at least a sampling transistor, a driving transistor, a light emitting element, and a storage capacitor, a control terminal of the sampling transistor being connected to a corresponding scanning line, one of two current terminals of the sampling transistor being connected to a corresponding signal line and the control terminal of the driving transistor, one of two current terminals of the driving transistor being connected to the light emitting element and the other one being connected to a power supply line, the storage capacitor being connected between the control terminal and one of the two current terminals of the driving transistor, the driving unit being configured to output a control signal over a selected scanning line to turn on the sampling transistor connected to the selected scanning line, and output an image signal over a selected signal line to write the image signal in the storage capacitor via the turned-on sampling transistor, whereby the driving transistor supplies a driving current, depending on a signal voltage of the written image signal, to the light emitting element during a predetermined light emission period, while the driving transistor supplies no driving current during a non-light emission period, each pixel including correction means and a switching transistor, the correction means being adapted to operate in the non-light emission period so as to write a correction voltage in the storage capacitor thereby to eliminate an effect of a variation in a characteristic of the driving transistor, the switching transistor being disposed between one of the two current terminals of the driving transistor and the light emitting element, and the switching transistor being adapted to turn off during the non-light emission period thereby to electrically disconnect the light emitting element from the one of the two current terminals of the driving transistor thereby preventing a leakage current from flowing through the light emitting element during the period in which the correction means operates and thus preventing the correction voltage from having an error due to the leakage current.

The correction means may additively write a correction voltage corresponding to a threshold voltage of the driving transistor into the storage capacitor so as to eliminate an effect of a variation in the threshold voltage of the driving transistor. The correction means may subtract a correction voltage depending on a mobility of the driving transistor from the signal voltage of the image signal written in the storage capacitor so as to eliminate an effect of a variation in the mobility of the driving transistor.

The present invention provides great advantages as described below. That is, in the display apparatus according to the embodiment of the present invention, a switching transistor is disposed between the source serving as a current output terminal of a driving transistor and the anode of a light emitting element. During the non-light emission period, the switching transistor is turned off to electrically disconnect the anode of the light emitting element from the source of the driving transistor. In this period, the correction means operates such that a correction voltage is written into the storage capacitor from the current output terminal (source) of the driving transistor so as to eliminate the effects of the variation in characteristic of the driving transistor. Because the anode of the light emitting element is electrically disconnected from the source of the driving transistor during the non-light emission period, no leakage current flows through the light emitting element and thus the potential of the current output terminal of the driving transistor does not have an error due to the leakage current. This makes it possible for the display apparatus to accurately make the correction without being influenced by leakage currents of light emitting elements, and thus it is possible to improve the uniformity in brightness over the screen.

In the correction process, it is necessary to apply the signal potential from the signal line to the control terminal (gate) of the driving transistor even in the non-light emission period. The cathode of the light emitting element is maintained at a predetermined fixed cathode potential. In the case where the anode of the light emitting element is connected to the source of the driving transistor during the correction process as in the related technique, it is necessary to adjust the relative signal potential with respect to the cathode potential to achieve high accuracy in the correction process. In contrast, in the embodiment of the invention, because the anode of the light emitting element is electrically disconnected from the source of the driving transistor during the correction process, it is allowed to set the signal potential applied to the gate of the driving transistor and the cathode potential of the cathode of the light emitting element independently of each other. Thus, the signal potential and the cathode potential can be properly set so as to achieve low power consumption of the panel and/or low cost.

DESCRIPTION OF THE PREFERRED EMBODIMENTS

Figure 1:
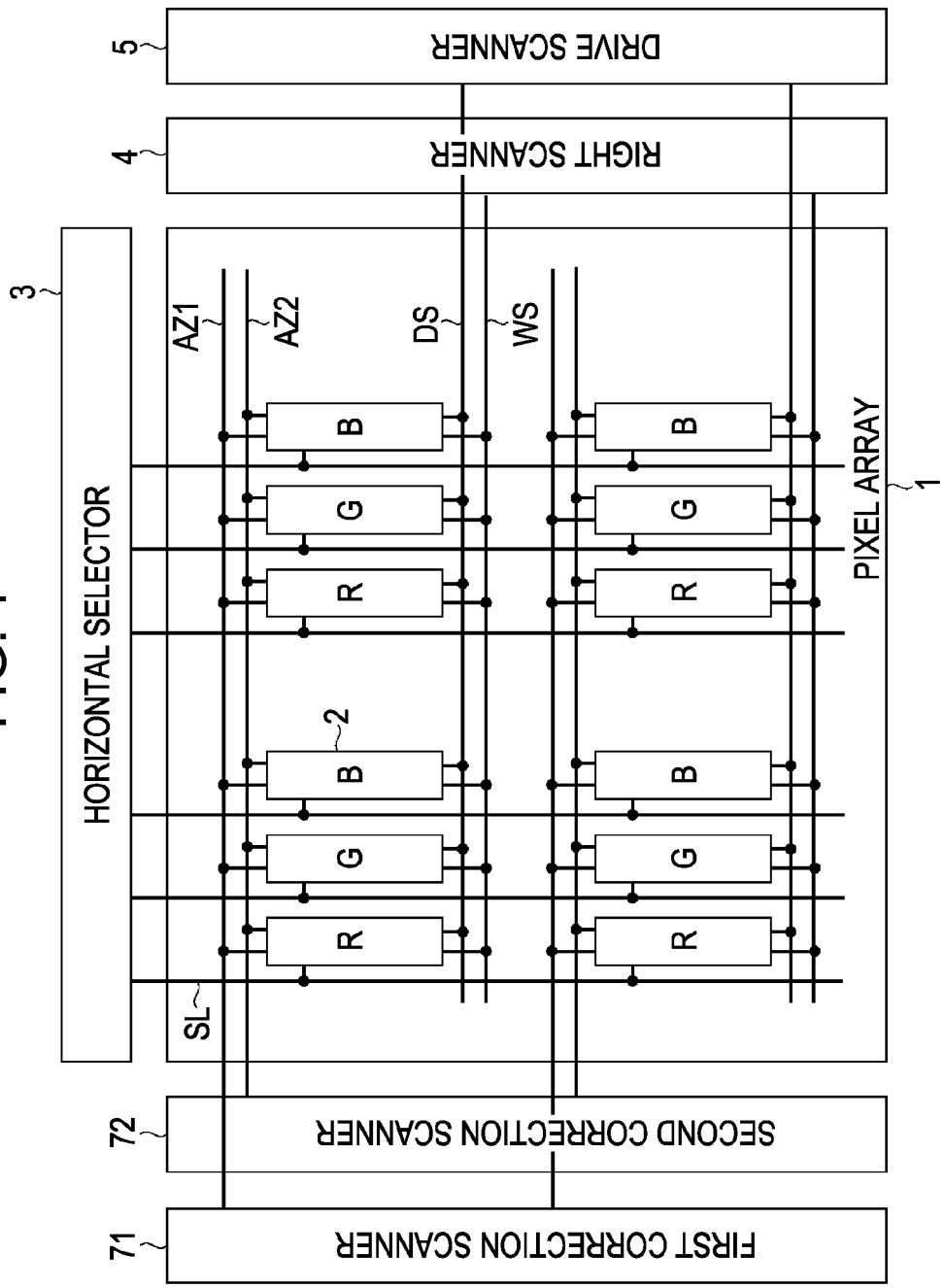
FIG. 1 is a block diagram illustrating an overall configuration of a first comparative example of a display apparatus.

The present invention is described in further detail below with reference to embodiments in conjunction with the accompanying drawings. First, to illustrate a background of the invention, a first comparative example of an active matrix display apparatus having a threshold voltage correction function and a mobility correction function is described below referring to FIG. 1. In this first comparative example, each pixel is basically composed of five transistors, one capacitor, and one light emitting element. As shown in FIG. 1, in the first comparative example, the active matrix display apparatus is basically composed of a pixel array 1 and a driving unit disposed in a peripheral area. The driving unit includes a horizontal selector 3, a write scanner 4, a drive scanner 5, a first correction scanner 71, and a second correction scanner 72. The pixel array 1 includes scanning lines WS extending in a row direction, signal lines SL extending in a column direction, and pixels 2 disposed in an array form at respective intersections of the scanning lines WS and the signal lines SL. To realize the capability of displaying a color image, three types of pixels may be used so that one of three primary colors (for example, red (R), green (G), and blue (B)) is represented by one of the three types of pixels, although the pixel array does not necessarily need to be configured in such a manner. The signal lines SL are driven by the horizontal selector 3. The horizontal selector 3 supplies an image signal over the signal lines SL. The scanning lines WS are scanned by the write scanner 4. Additional scanning lines DS, AZ1 and AZ2 are disposed such that they extend parallel to the scanning lines WS. The scanning lines DS are scanned by the drive scanner 5. The scanning lines AZ1 are scanned by the correction scanner 71. The scanning lines AZ2 are scanned by the second correction scanner 72. When each pixel 2 is selected by a scanning line WS, the pixel 2 samples the image signal supplied via a signal line SL. When each pixel 2 is then selected by a scanning line DS, a light emitting element in the pixel 2 is driven in accordance with the sampled image signal. When each pixel 2 is scanned by scanning lines AZ1 and AZ2, a predetermined correction operation is performed.

Figure 2:
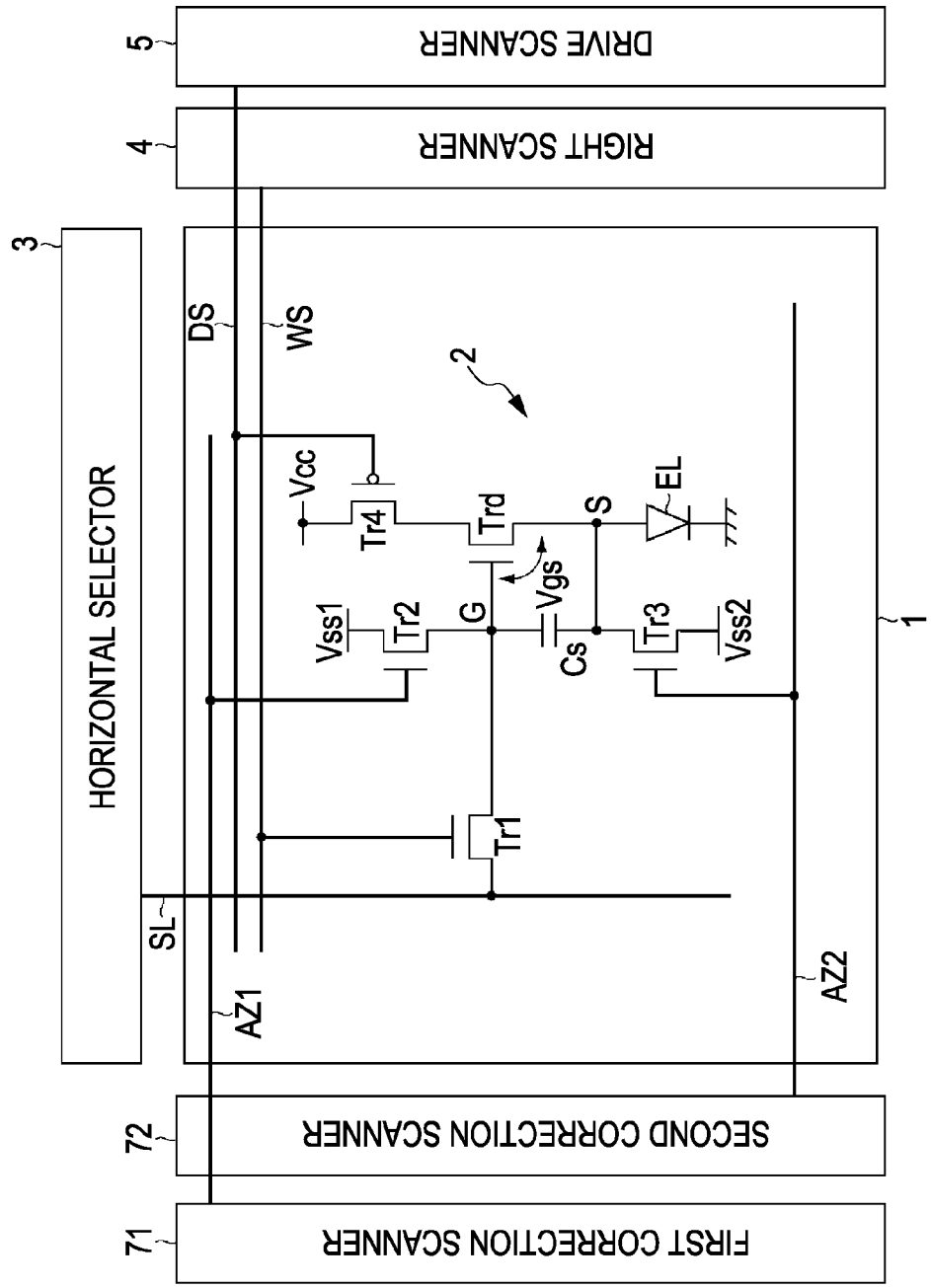
FIG. 2 is a circuit diagram illustrating a specific configuration of the first comparative example of the display apparatus.

FIG. 2 is a circuit diagram illustrating a specific example of a configuration of the display apparatus of the first comparative example shown in FIG. 1. In FIG. 2, for ease of understanding, only one pixel circuit 2 is shown in an enlarged manner. Each pixel circuit 2 includes five thin film transistors Tr1 to Tr4 and Trd, one capacitor (storage capacitor) Cs, and one light emitting element EL. The transistors Tr1 to Tr3 and Trd are N-channel type polysilicon TFTs. On the other hand, the transistor Tr4 is a P-channel type polysilicon TFT. The capacitor Cs functions as a storage capacitor in the pixel circuit 2. The light emitting element EL is, for example, an organic electroluminescent element of a diode type having an anode and a cathode. Note that the light emitting element is not limited to the organic electroluminescent element of the diode type, but the light emitting element may be of any type as long as it emits light according to a driving current passing through it.

The driving transistor Trd is a key device in the pixel circuit 2. The gate G of the driving transistor Trd is connected to one end of the storage capacitor Cs, and the source S thereof is connected to the other end of the storage capacitor Cs. Furthermore, the gate G of the driving transistor Trd is connected to a reference potential Vss1 via a switching transistor Tr2. The drain of the driving transistor Trd is connected to a power supply Vcc via a switching transistor Tr4. The gate of the switching transistor Tr2 is connected to one of the scanning lines AZ1. The gate of the switching transistor Tr4 is connected to one of the scanning lines DS. The anode of the light emitting element EL is connected to the source S of the driving transistor Trd, and the cathode of the light emitting element EL is grounded to a ground potential Vcath. The switching transistor Tr3 is connected between the source S of the driving transistor Trd and a reference potential Vss2. The gate of the transistor Tr3 is connected to one of the scanning lines AZ2. The sampling transistor Tr1 is connected between the signal line SL and the gate G of the driving transistor Trd. The gate of the sampling transistor Tr1 is connected to one of the scanning lines WS.

In the pixel circuit 2 configured in the above-described manner, the sampling transistor Tr1 turns on in response to the control signal WS supplied via the scanning line WS during a sampling period, whereby the image signal Vsig supplied via the signal line SL is sampled in the storage capacitor Cs. The image signal Vsig sampled in the storage capacitor Cs is applied as an input voltage Vgs between the gate G and the source S of the driving transistor. The driving transistor Trd supplies an output current Ids corresponding to the input voltage Vgs to the light emitting element EL over the light emission period. Note that the output current (drain current) Ids depends on the carrier mobility μ of the channel region of the driving transistor Trd and also on the threshold voltage Vth of the driving transistor Trd. The light emitting element EL is driven by the output current Ids supplied from the driving transistor Trd and emits light with intensity corresponding to the supplied image signal Vsig.

The pixel circuit 2 has a correction mechanism implemented by the switching transistors Tr2 to Tr4 to eliminate the effects of the dependence of the output current Ids on the carrier mobility μ by adjusting the input voltage Vgs stored in the storage capacitor Cs before the light emission period. More specifically, the correction mechanism (Tr2 to Tr4) operates during a part of the sampling period in accordance with the control signals WS and DS supplied via the scanning lines WS and DS such that when the image signal Vsig is being sampled, the output current Ids of the driving transistor Trd is negatively fed back to the storage capacitor Cs so as to adjust the input voltage Vgs. Furthermore, to eliminate the effects of the dependence of the output current Ids on the threshold voltage Vth, before the start of the sampling period, the correction mechanism (Tr2 to Tr4) detects the threshold voltage Vth of the driving transistor Trd and adds the detected threshold voltage Vth to the input voltage Vgs.

In the present comparative example, the driving transistor Trd is of the N-channel type, and is connected such that the drain thereof is connected to the power supply Vcc and the source S is connected to the light emitting element EL. In this configuration, during a partial period at the end of the sampling period, the correction mechanism operates as follows. The output current Ids of the driving transistor Trd is negatively fed back to the storage capacitor Cs such that the output current Ids extracted from the source S of the driving transistor Trd is fed into the capacitance of the light emitting element EL before the light emission period. More specifically, the light emitting element EL is of the diode type having an anode and a cathode, wherein the anode is connected to the source S of the driving transistor Trd, and the cathode is grounded. In this configuration, the correction mechanism (Tr2 to Tr4) operates such that the light emitting element EL is reversely biased between its anode and cathode in advance so that the diode-type light emitting element EL functions as a capacitor when the output current Ids extracted from the source S of the driving transistor Trd is fed into the light emitting element EL. This correction mechanism is configured such that the length of the period in which the output current Ids is extracted from the driving transistor Trd can be adjusted within the sampling period to optimize the amount of feedback of the output current Ids to the storage capacitor Cs.

Figure 3:
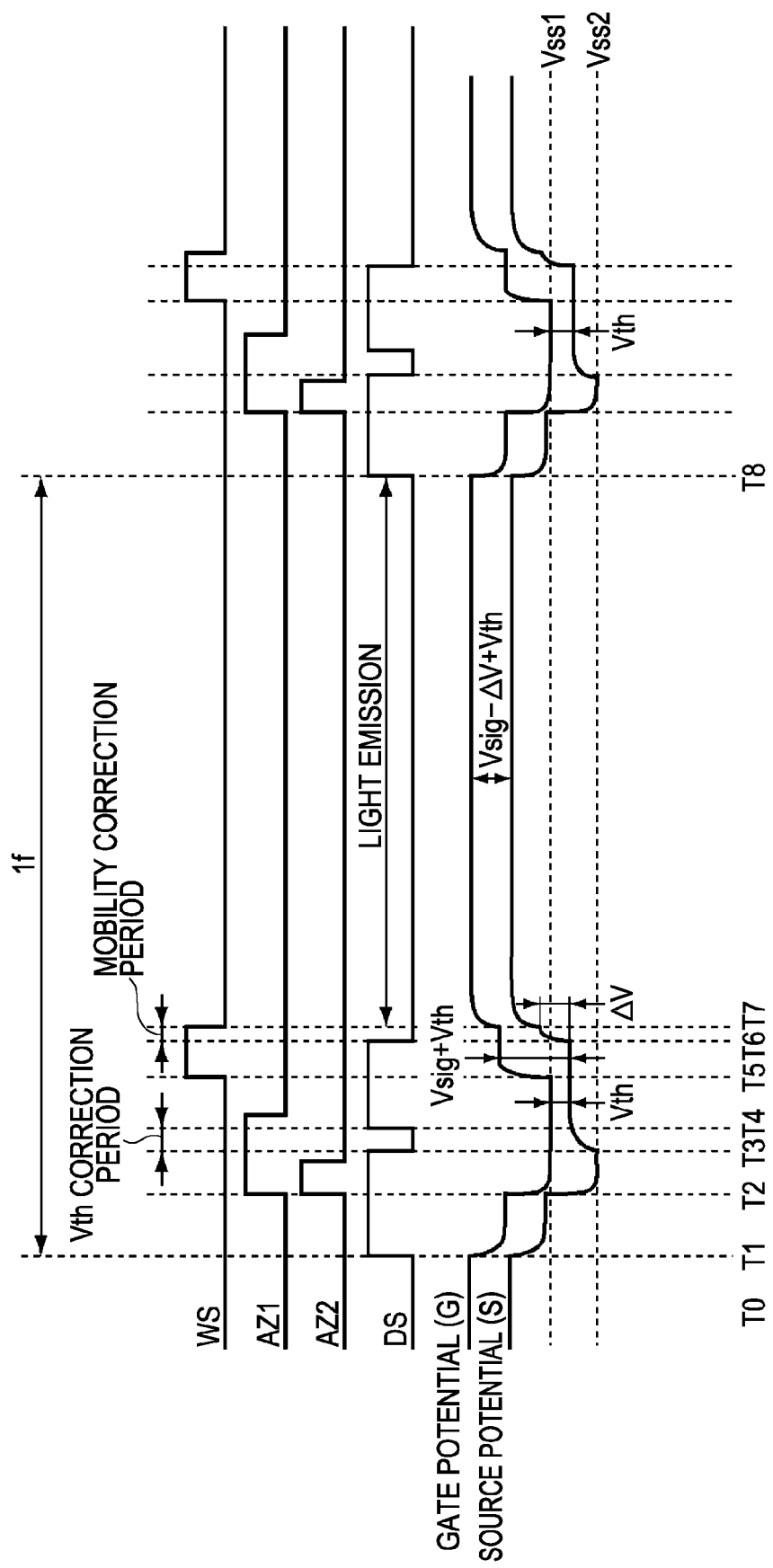
FIG. 3 is a timing chart provided for an explanation of an operation of the first comparative example of the display apparatus.

FIG. 3 is a timing chart associated with the operation of the display apparatus of the first comparative example shown in FIG. 2. Referring to FIG. 3, the operation of display apparatus shown in FIG. 2 is described below. FIG. 3 shows waveforms, along time T, of control signals applied to the scanning lines WS, AZ1, AZ2, and DS. For simplicity, the control signals are denoted by the same symbols as those denoting the scanning lines. Because the transistors Tr1, Tr2, and Tr3 are of the N-channel type, each of the transistors Tr1, Tr2, and Tr3 turns on when the scanning line WS, AZ1, or AZ2 is at a high level and turns off when the scanning line WS, AZ1, or AZ2 is at a low level. On the other hand, the transistor Tr4 is of the P-channel type, and thus the transistor Tr4 turns off when the scanning line DS is at a high level, and the transistor Tr4 turns on when the scanning line DS is at a low level. In the timing chart, in addition to the waveforms of the control signals WS, AZ1, AZ2, and DS, changes in voltages of the gate G and the source S of the driving transistor Trd are also shown.

In the timing chart shown in FIG. 3, a period from time T1 to time T8 corresponds to one field (1f) in which the rows of the pixel array are sequentially scanned once. Note that in the timing chart, the waveforms of the control signals WS, AZ1, AZ2, and DS applied to pixels are shown only for one row.

At time T0 before the start of the field, the control lines WS, AZ1, AZ2, and DS are at the low level. Therefore, the N-channel transistors Tr1, Tr2, and Tr3 are in the off-state, while the P-channel transistor Tr4 is in the on-state. Thus, the driving transistor Trd is electrically connected to the power supply Vcc via the transistor Tr4 being in the on-state, and the output current Ids depending on the input voltage Vgs is supplied to the light emitting element EL. Thus, at time T0, the light emitting element EL is emitting light. In this state, the input voltage Vgs applied to the driving transistor Trd is given by the difference between the gate potential (G) and the source potential (S).

At time T1 at which the field starts, the control signal DS rises up from the low level to the high level. As a result, the transistor Tr4 turns off, and the driving transistor Trd is electrically disconnected from the power supply Vcc. Thus, the emission of light is stopped, and the operation enters a non-light emission period. Thus, at time T1, all transistors Tr1 to Tr4 turn off.

Thereafter, at time T2, the control signals AZ1 and AZ2 rise up to the high level, and thus the switching transistor Tr2 and Tr3 turn on. As a result, the gate G of the driving transistor Trd is connected to the reference potential Vss1, and the source S is connected to the reference potential Vss2. In this state, parameters are set Vss1−Vss2>Vth and Vss1−Vss2=Vgs>Vth are satisfied so as to make it possible to properly perform the Vth correction process in a following period starting from time T3. In other words, the period from T2 to T3 functions as a resetting period in which the driving transistor Trd is reset. Furthermore, when the threshold voltage of the light emitting element EL is denoted by VthEL, parameters are set such that VthEL>Vss2 is satisfied, and thus the light emitting element EL is negatively biased. This negative biasing is necessary to make proper corrections in terms of Vth and the carrier mobility, in a later processing step.

At about time. T3, the control signal AZ2 is switched to the low level, and immediately thereafter, the control signal DS is also switched to the low level. As a result, the transistor Tr3 turns off and the transistor Tr4 turns on. Thus, the drain current Ids flows into the storage capacitor Cs, and the Vth correction operation starts. In this correction operation, the gate G of the driving transistor Trd is maintained at Vss1, and the current Ids flows until the driving transistor Trd turns off. When the driving transistor Trd turns off, the source potential (S) of the driving transistor Trd is equal to Vss1−Vth. At time T4 after the drain current is cut off, the control signal DS is returned to the high level to turn off the switching transistor Tr4. The control signal AZ1 is then also returned to the low level to turn off the switching transistor Tr2. As a result, Vth is stored and retained in the storage capacitor Cs. As described above, the threshold voltage Vth of the driving transistor Trd is detected in the period from T3 to T4. Thus, hereinafter, the period T3 to T4 will be referred to as a Vth correction period.

At time T5 after completion of the Vth correction, the control signal WS is switched to the high level to turn on the sampling transistor Tr1 thereby writing the image signal Vsig to the storage capacitor Cs. The capacitance of the storage capacitor Cs is much smaller than the capacitance of the equivalent capacitance Coled of the light emitting element EL. As a result, most part of the image signal Vsig is written in the storage capacitor Cs. More specifically, the voltage of the image signal Vsig with respect to Vss1, that is, Vsig−Vss1 is written in the storage capacitor Cs. Thus, the voltage Vgs between the gate G and the source S of the driving transistor Trd is given by Vth detected in the previous step plus the sampled voltage Vsig−Vss1, that is, Vsig−Vss1+Vth. In the following discussion, for simplicity, let us assume that Vss1=0 V. In this case, as shown in the timing chart of FIG. 3, the gate-source voltage Vgs is given by Vsig+Vth. The sampling of the image signal Vsig is continued until the control signal WS is returned to the low level at time T7. Thus, the period from T5 to T7 functions as the sampling period.

At time T6 before the end T7 of the sampling period, the control signal DS falls down to the low level. As a result, the switching transistor Tr4 turns on. Thus, the driving transistor Trd is electrically connected to the power supply Vcc, and the pixel circuit proceeds from the non-light emission period to a light emission period. In the period from T6 to T7 in which the sampling transistor Tr1 is still in the on-state and the switching transistor Tr4 is turned on, the correction is made as to the carrier mobility of the driving transistor Trd. That is, in the present comparative example, the carrier mobility correction is performed in the period from T6 to T7 in the tail of the sampling period. At the beginning of the period in which the carrier mobility correction is performed, the light emitting element EL is actually in the reverse-biased state, and thus no light is emitted. In this mobility correction period from T6 to T7, the drain current Ids flows through the driving transistor Trd in the state in which the gate G of the driving transistor Trd is maintained at the voltage of the image signal Vsig. In this state, Vss1−Vth<VthEL is satisfied, that is, the light emitting element EL is reversely biased, and thus the light emitting element EL functions not as a diode but as a capacitor. Thus, the current Ids passing through the driving transistor Trd is written into the total capacitor of the storage capacitor Cs and the equivalent capacitor Coled. As a result, the source potential (S) of the driving transistor Trd rises up. In the timing chart shown in FIG. 3, the increase in the source potential is denoted by ΔV. The gate-source voltage Vgs stored in the storage capacitor Cs is reduced by the increase in the source potential ΔV, and thus negative feedback occurs. As a result of the negative feedback of the output current Ids of the driving transistor Trd to the input voltage Vgs of the driving transistor Trd, the correction associated with the mobility μ is performed. The amount of the negative feedback ΔV can be optimized by adjusting the length t of the mobility correction period from T6 to T7.

At time T7, the control signal WS falls down to the low level, and thus the sampling transistor Tr1 turns off. As a result the gate G of the driving transistor Trd is electrically disconnected from the signal line SL. Thus, the image signal Vsig is no longer applied to the gate G of the driving transistor Trd, and the gate potential (G) of the driving transistor Trd rises up with the source potential (S). In this transition process, the gate-source voltage Vgs is maintained at the voltage stored in the storage capacitor Cs, i.e., (Vsig−ΔV+Vth). As a result of the increase in the source potential (S), the bias of the light emitting element EL is switched from the reverse bias to the forward bias, and the output current Ids flows through the light emitting element EL. Thus, the light emitting element EL starts emitting light. In this state, the dependence of the drain current Ids on the gate voltage Vgs can be obtained by substituting Vsig−ΔV+Vth into Vgs in the transistor characteristic equation described above, that is, the output current Id is given by $$Ids = k\mu(Vgs-Vth)^2 = k\mu(Vsig-\Delta V)^2$$

where $$k=(1/2)(W/L)Cox$$

As can be seen from the above equation, the resultant output current Ids no longer includes a term of Vth, that is, the output current Ids supplied to the light emitting element EL does not depend on the threshold voltage Vth of the driving transistor Trd. Thus, the drain current Ids is basically determined by the signal voltage Vsig of the image signal. In other words, the light emitting element EL emits light with intensity corresponding to the image signal Vsig corrected by the feedback ΔV. The amount of correction value ΔV is determined so as to eliminate the effect of the mobility g in the coefficient of the characteristic equation. As a result, the drain current Ids depends only on the image signal Vsig.

At time T8, the control signal DS rises up to the high level, and the switching transistor Tr4 turns off. As a result, light emission is stopped, and the present field ends. Thereafter, a next field is subjected to the similar operation including the Vth correction process, the mobility correction process, and the light emission process.

Figure 4:
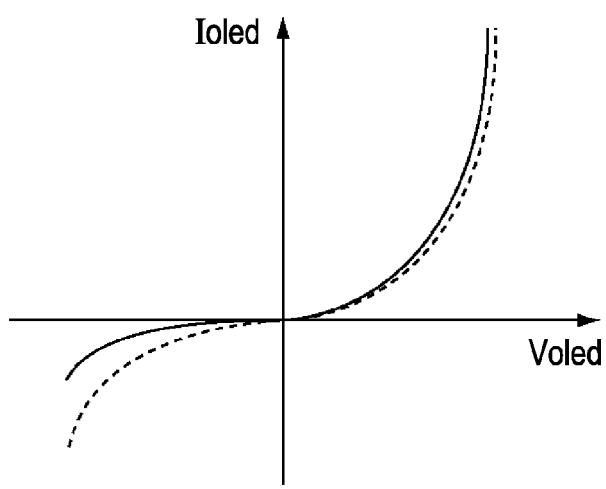
FIG. 4 is a graph illustrating a current-voltage characteristic of a light emitting element.

FIG. 4 illustrates an example of the current-voltage characteristic of the light emitting element EL. In this figure, a vertical axis represents the current Ioled and a horizontal axis represents the voltage Voled. In the case of the light emitting element included in the pixel circuit, Ioled is given by the drain current Ids supplied from the driving transistor Trd, and Voled is given by the source potential of the driving transistor (i.e., the anode potential of the light emitting element). As can be seen from the graph shown in FIG. 4, when Voled is negative and thus when the light emitting element is negatively biased, the light emitting element turns off as with usual diodes, and no current flows other than a leakage current. The leakage current varies from one light emitting element to another, i.e., some light emitting element has a large current as represented by a dotted line in FIG. 4, while some light emitting element has a small leakage current as represented by a solid line.

In the display apparatus of the first comparative example, the threshold correction process and the mobility correction process are performed in the state in which the light emitting element is reversely biased. When the light emitting element is in the reverse-biased state, a leakage current flows in the reverse direction as described above. The leakage current can cause the source potential of the driving transistor to change in the threshold voltage correction process or the mobility correction process, and thus an error can occur in the corrections. As shown in FIG. 4, the bias characteristic of the light emitting element EL varies from one element to another. This means that there can be a light emitting element having a relatively large leakage current compared with other light emitting elements. In a pixel including such a light emitting element having a large leakage current, the large leakage current flowing through the pixel circuit causes a large current to flow into the source of the driving transistor Trd in the mobility correction process or the threshold voltage correction process, and thus a reduction in Vgs stored in the storage capacitor Cs occurs. This leads to a reduction in the intensity of light emitted by this pixel. If this light emitting element EL is continuously operated, the leakage characteristic can change with time, which causes a change in intensity with time.

In the display apparatus of the first comparative example, the source potential of the driving transistor Trd increases during the mobility correction process. To achieve the accurate correction, the source voltage of the driving transistor needs to have a value which does not turn on the light emitting element after completion of the mobility correction process. To this end, the cathode potential needs to be set to be relatively high with respect to the signal potential. However, the setting of the cathode potential to a relatively high value with respect to the signal potential needs a large power supply voltage applied to the panel, which leads to an increase in power consumption. The source potential of the driving transistor can be maintained within the range which does not cause the light emitting element to turn on at the point of time at which the mobility correction process is ended, if the signal potential is set to be relatively low with respect to the cathode voltage. However, in this case, a negative input voltage is applied to the gate of the driving transistor, which leads to an increase in cost for the driver which outputs the image signal. As can be seen from the above discussion, to achieve a panel with high image quality without increasing power consumption or cost, it is desirable to avoid the effects of the leakage currents of the light emitting elements on the light emission intensity.

Figure 5:
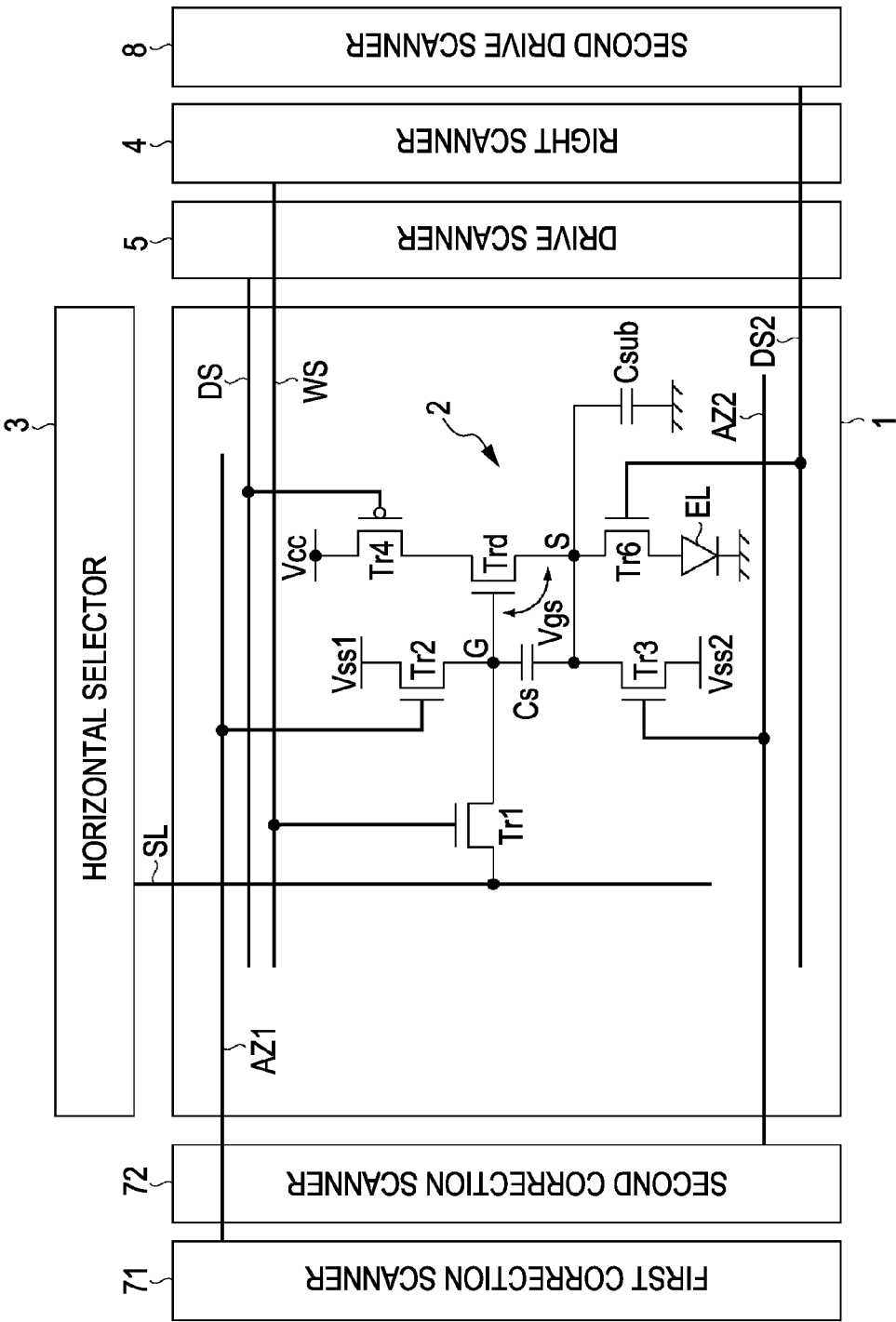
FIG. 5 is circuit diagram illustrating a display apparatus according a first embodiment of the present invention.

FIG. 5 is a circuit diagram of a display apparatus according to a first embodiment of the present invention. The circuit of the display apparatus according to the present embodiment is configured to solve the problems in the first comparative example described above. In FIG. 5, for ease of understanding, similar parts to those in FIG. 2 are denoted by similar reference symbols. This circuit is different from that of the first comparative example in that a switching transistor Tr6 is disposed between the source S of the driving transistor Trd and the anode of the light emitting element EL. To control the gate of this switching transistor Tr6, additional scanning lines DS2 extending parallel to the scanning lines WS are disposed in the pixel array 1. Correspondingly, to sequentially supply a control signal to the scanning lines DS2, the driving unit disposed in the peripheral area additionally includes second drive scanner 8. The switching transistor Tr6 is maintained in the off-state during the threshold voltage correction period and the mobility correction period thereby eliminating the effects of the leakage current of the light emitting element EL and thus avoiding the degradation in uniformity of intensity across the screen. Furthermore, because the driving transistor Trd is electrically disconnected from the light emitting element EL, it becomes possible to set the cathode potential of the light emitting element EL and the signal voltage applied to the driving transistor Trd independently of each other, which allows a reduction in power consumption of the panel and a reduction in cost.

As shown in FIG. 5, in the first embodiment of the present invention, the display apparatus basically includes a pixel array 1 and a driving unit adapted to drive the pixel array 1. The pixel array 1 includes scanning lines WS extending in the row direction, signal lines SL extending in the column direction, and pixels 2 disposed in an array form at respective intersections of the scanning lines WS and the signal lines SL. Each pixel 2 includes, at least, a sampling transistor Tr1, a driving transistor Trd, a light emitting element EL, and a storage capacitor Cs. The control terminal (the gate) of the sampling transistor Tr1 is connected to one of the scanning lines WS. The current terminals (the source and the drain) of the sampling transistor Tr1 are respectively connected to one of the signal lines SL and the control terminal (the gate G) of the driving transistor Trd. One of the current terminals (the source and the drain) of the driving transistor Trd is connected to the light emitting element EL, and the other one is connected to a power supply line Vcc. More specifically, in the present embodiment, the driving transistor Trd is of the N-channel type, and thus the source S is connected to the anode of the light emitting element EL. The storage capacitor Cs is connected between the control terminal (the gate G) and the output current terminal (the source S) of the driving transistor Trd. An auxiliary capacitor Csub is connected between the source S of the driving transistor Trd and a ground line.

The driving unit includes a write scanner 4 adapted to output a control signal over the scanning line WS thereby to turn on the sampling transistor Tr1. The driving unit also includes a horizontal selector 3 adapted to output an image signal over the signal line SL such that the image signal is written in the storage capacitor Cs via the turned-on sampling transistor Tr1. Thus, the driving transistor Trd operates such that the driving current Ids corresponding to the image signal written as the signal voltage is supplied to the light emitting element EL during the light emission period, while no driving current is supplied to the light emitting element EL during the non-light emission period.

The present embodiment is characterized that each pixel circuit 2 has a correction mechanism and a switching transistor Tr6. The correction mechanism is implemented by correction transistors Tr2, Tr3, and Tr4 and other elements, and operates during the non-light emission period such that a correction voltage is written in the storage capacitor Cs thereby to cancel out the variation in characteristics of the driving transistors Trd. The switching transistor Tr6 is located between the source of the driving transistor Trd and the anode of the light emitting element EL, and the switching transistor Tr6 is turned off during the non-light emission period whereby the light emitting element EL is electrically disconnected from the source S of the driving transistor Trd so that no leakage current flows into the light emitting element EL during the period in which the correction mechanism thereby preventing an error due to the leakage current.

More specifically, the correction mechanism (Tr2, Tr3, and Tr4) operates such that the correction voltage corresponding to the threshold voltage Vth is added to the voltage stored in the storage capacitor Cs thereby eliminating the effects of the variation in the threshold voltage Vth of the driving transistor Trd. Furthermore, the correction mechanism subtracts a correction voltage corresponding to the mobility μ from the image signal written as the signal voltage in the storage capacitor Cs thereby eliminating the effects of the variation in the mobility μ of the driving transistor Trd.

As can be seen from the above discussion, the source S of the driving transistor Trd is disconnected from the light emitting element EL during the mobility correction period. Therefore, even if the source potential of the driving transistor Trd increases to a value that otherwise would turn on the light emitting element EL in the mobility correction period, no problem occurs in the operation. Thus, in the present embodiment, unlike the first comparative example described above, it is allowed to set the cathode voltage of the light emitting element EL and the signal voltage applied to the gate G of the driving transistor Trd independently of each other. Therefore, the image signal is allowed to be set in a positive range, which allows a reduction in cost of the driver of the horizontal selector 3. Furthermore, the cathode voltage is allowed to be set to the ground voltage, which allows the power consumption of the panel to be minimized.

Figure 6:
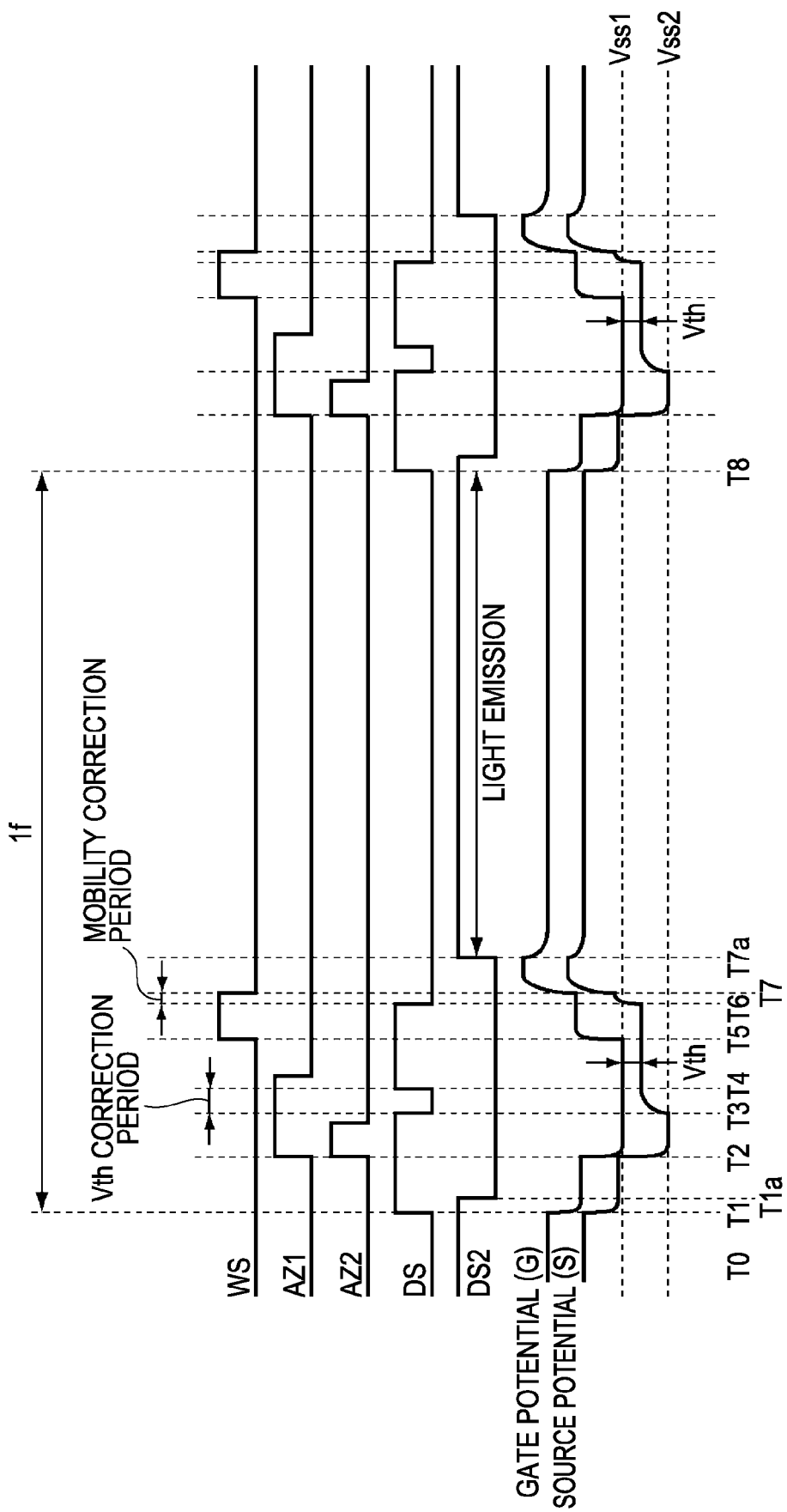
FIG. 6 is timing chart provided for an explanation of an operation of the display apparatus according to the first embodiment of the present invention.

With reference to FIG. 6, the operation of the display apparatus according to the first embodiment shown in FIG. 5 is described in further detail below. In FIG. 6, for ease of understanding, similar reference symbols to those in the timing chart shown in FIG. 3 associated with the first comparative example are used. At time T0 before the start of each field, the control lines WS, AZ1, AZ2, and DS are all at the low level. Therefore, the N-channel transistors Tr1, Tr2, and Tr3 are in the off-state, while the P-channel transistor Tr4 is in the on-state. Thus, the driving transistor Trd is electrically connected to the power supply Vcc via the transistor Tr4 being in the on-state, and the output current Ids depending on the input voltage Vgs is supplied to the light emitting element EL. Thus, at time T0, the light emitting element EL is emitting light. In this state, the input voltage Vgs applied to the driving transistor Trd is given by the difference between the gate potential (G) and the source potential (S).

At time T1 at which the field starts, the control signal DS rises up from the low level to the high level. As a result, the transistor Tr4 turns off, and the driving transistor Trd is electrically disconnected from the power supply Vcc. Thus, the emission of light is stopped, and the operation enters a non-light emission period. Thus, at time T1, all transistors Tr1 to Tr4 turn off.

Thereafter, at time T1a, the control signal DS2 is switched to the low level to turn off the switching transistor Tr6. As a result, the light emitting element EL is electrically disconnected from the driving transistor Trd during the non-light emission period. Although in the present embodiment, the switching transistor Tr4 is turned off at time T1 and then the switching transistor Tr6 is turned off, the switching transistor Tr6 may be turned off first and then the switching transistor Tr4 may be turned off. Note that the light emitting element EL should be disconnected before the correction switching transistors Tr2 and Tr3 are turned on.

Thereafter, at time T2, the control signals AZ1 and AZ2 rise up to the high level, and thus the switching transistor Tr2 and Tr3 turn on. As a result, the gate G of the driving transistor Trd is connected to the reference potential Vss1, and the source S is connected to the reference potential Vss2. In this state, parameters are set Vss1−Vss2>Vth and Vss1−Vss2=Vgs>Vth are satisfied so as to make it possible to properly perform the Vth correction process in a following period starting from time T3. At this point of time, the light emitting element EL has already been disconnected from the source S of the driving transistor Trd. Therefore, the light emitting element EL does not need to be reversely biased.

At time T3, the control signal AZ2 is switched to the low level, and immediately thereafter, the control signal DS is also switched to the low level. As a result, the transistor Tr3 turns off and the transistor Tr4 turns on. As a result, the drain current Ids flows into the storage capacitor Cs, and the Vth correction operation starts. In this state, the gate G of the driving transistor Trd is maintained at Vss1, and the current Ids flows until the driving transistor Trd turns off. When the driving transistor Trd turns off, the source potential (S) of the driving transistor Trd is equal to Vss1−Vth. At time T4 after the drain current is cut off, the control signal DS is returned to the high level to turn off the switching transistor Tr4. The control signal AZ1 is then also returned to the low level to turn off the switching transistor Tr2. As a result, Vth is stored and retained in the storage capacitor Cs. As described above, the threshold voltage Vth of the driving transistor Trd is detected in the period from T3 to T4. Thus, hereinafter, the period T3 to T4 will be referred to as a Vth correction period.

At time T5 after completion of the Vth correction, the control signal WS is switched to the high level to turn on the sampling transistor Tr1 thereby writing the image signal Vsig to the storage capacitor Cs. The capacitance of the storage capacitor Cs is much smaller than the capacitance of the auxiliary capacitance Csub. As a result, most of the image signal Vsig is written in the storage capacitor Cs. More specifically, the voltage of the image signal Vsig with respect to Vss1, that is, Vsig−Vss1 is written in the storage capacitor Cs. Therefore, the voltage Vgs between the gate G and the source S of the driving transistor Trd is given by Vth detected in the previous step plus the sampled voltage Vsig−Vss1, that is, Vsig−Vss1+Vth. In the following discussion, for simplicity, let us assume that Vss1=0 V. In this case, as shown in the timing chart of FIG. 6, the gate-source voltage Vgs is given by Vsig+Vth. The sampling of the image signal Vsig is continued until the control signal WS is returned to the low level at time T7. Thus, the period from T5 to T7 functions as the sampling period.

At time T6 before the end T7 of the sampling period, the control signal DS falls down to the low level. As a result, the switching transistor Tr4 turns on. Thus, the driving transistor Trd is electrically connected to the power supply Vcc. In the period from T6 to T7 in which the sampling transistor Tr1 is still in the on-state and the switching transistor Tr4 is turned on, the correction is made as to the carrier mobility of the driving transistor Trd. Note that in this period, the light emitting element EL is still disconnected from the source S of the driving transistor Trd. In this mobility correction period from T6 to T7, the drain current Ids flows through the driving transistor Trd in the state in which the gate G of the driving transistor Trd is maintained at the voltage of the image signal Vsig. Thus, the current Ids passing through the driving transistor Trd is written into the total capacitor of the storage capacitor Cs and the auxiliary capacitor, i.e., C=Cs+Csub. As a result, the source potential (S) of the driving transistor Trd rises up. The gate-source voltage Vgs stored in the storage capacitor Cs is reduced by the increase in the source potential $\Delta V$, and thus negative feedback occurs. As a result of the negative feedback of the output current Ids of the driving transistor Trd to the input voltage Vgs of the driving transistor Trd, the effects of the variation in the mobility $\mu$ are eliminated.

At time T7, the control signal WS falls down to the low level, and thus the sampling transistor Tr1 turns off. As a result, the gate G of the driving transistor Trd is disconnected from the signal line SL. Thus, the image signal Vsig is no longer applied to the gate G of the driving transistor Trd, and the gate potential (G) of the driving transistor Trd rises up with the source potential (S). More specifically, in the present embodiment, because the source S of the driving transistor Trd is disconnected from the light emitting element EL, the source potential increases until it becomes substantially equal to the power supply voltage Vcc. Thus, in response to the rising of the source potential, the gate potential of the driving transistor Trd also rises. In this transition process, the gate-source voltage Vgs is maintained at the voltage stored in the storage capacitor Cs, i.e., (Vsig−$\Delta V$+Vth).

Thereafter, at time T7a, the control signal DS2 rises up to the high level. As a result, the switching transistor Tr6 turns on, and the light emitting element EL is electrically connected to the driving transistor Trd. As a result, the driving current Ids supplied from the driving transistor Trd flows into the light emitting element EL, and light is emitted by the light emitting element EL. In this process, the source potential of the driving transistor Trd (and thus also the anode potential of the light emitting element EL) falls down to a level determined by operating points of the driving transistor Trd and the light emitting element EL and remains at this stable level over the following light emission period.

Finally, at time T8, the control signal DS rises up to the high level, and the switching transistor Tr4 turns off. As a result, light emission is stopped, and the present field ends. Thereafter, a next field is subjected to the similar operation including the Vth correction process, the mobility correction process, and the light emission process.

Figure 7:
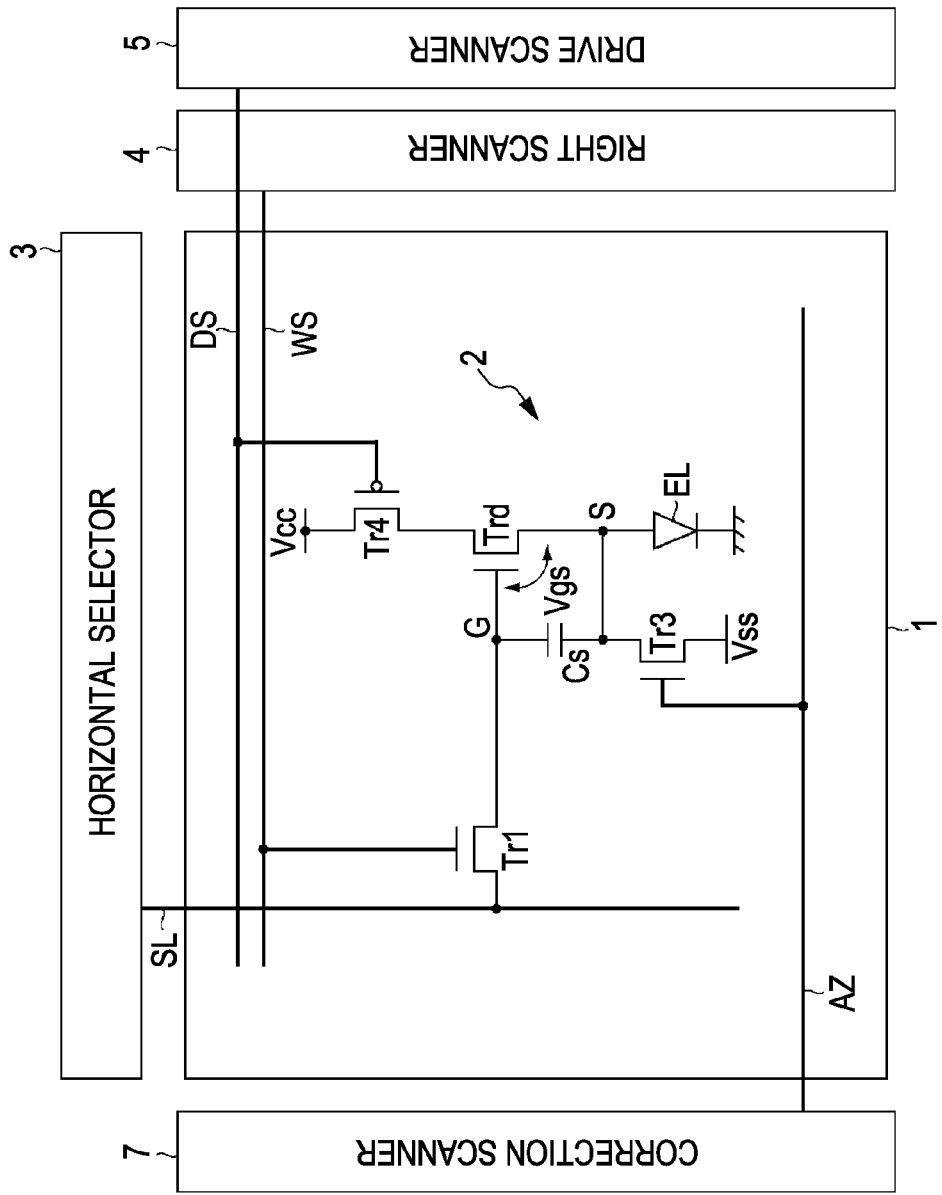
FIG. 7 is a circuit diagram of a second comparative example of a display apparatus.

FIG. 7 is a circuit diagram of a second comparative example of a display apparatus. In this second comparative example, each pixel is basically composed of four transistors, one storage capacitor, and one light emitting element. Note that in this second comparative example, in contrast to the first comparative example shown in FIG. 2 in which five transistors are used, only four transistors are used. The driving transistor Trd is a key device in the pixel circuit 2. The gate G of the driving transistor Trd is connected to one end of the storage capacitor Cs, and the source S thereof is connected to the other end of the storage capacitor Cs. The drain of the driving transistor Trd is connected to a power supply Vcc via a switching transistor Tr4. The gate of the switching transistor Tr4 is connected to one of the scanning lines DS. The anode of the light emitting element EL is connected to the source S of the driving transistor Trd, and the cathode of the light emitting element EL is grounded to a ground potential Vcath. A second switching transistor Tr3 is connected between the source S of the driving transistor Trd and a reference potential Vss. The gate of the transistor Tr3 is connected to one of the scanning lines AZ. A sampling transistor Tr1 is connected between the gate G of the driving transistor Trd and the signal line SL. The gate of the sampling transistor Tr1 is connected to one of the scanning lines WS.

In this configuration, in a horizontal scanning period (1H) assigned to a scanning line WS, the sampling transistor Tr1 turns on in response to the control signal WS supplied via the scanning line WS whereby the image signal Vsig supplied via the signal line SL is sampled in the storage capacitor Cs. The image signal Vsig sampled in the storage capacitor Cs is applied as an input voltage Vgs to the gate G of the driving transistor Trd. The driving transistor Trd supplies an output current Ids corresponding to the input voltage Vgs to the light emitting element EL over the light emission period. Note that the output current Ids depends on the threshold voltage Vth of the driving transistor Trd. The light emitting element EL is driven by the output current Ids supplied from the driving transistor Trd and emits light with intensity corresponding to the supplied image signal Vsig.

The pixel circuit 2 has a correction mechanism implemented by the first switching transistor Tr3 and the second switching transistor Tr4. The correction mechanism operates in a partial period in the horizontal scanning period (1H) to eliminate the effects of the dependence of the output current Ids on the threshold voltage Vth. More specifically, the threshold voltage Vth of the driving transistor Trd is detected and written in the storage capacitor Cs. The correction mechanism operates in the state in which the sampling transistor Tr1 turns on in the horizontal scanning period (1H) and one end of the storage capacitor Cs is maintained at the fixed voltage Vss0 via the signal line SL. In this state, the storage capacitor Cs is charged by a voltage applied to the other end of the storage capacitor Cs until the voltage on the other end of the storage capacitor Cs with respect to the fixed voltage Vss0 becomes equal to the threshold voltage Vth. After the threshold voltage Vth of the driving transistor Trd is detected and written in the storage capacitor Cs in the first half of the horizontal scanning period (1H), then in the second half of the horizontal scanning period, the sampling transistor Tr1 samples the image signal Vsig supplied via the signal line SL and writes the sampled signal voltage in the storage capacitor Cs. As a result, the input voltage Vgs equal to the sum of the sampled image signal Vsig and the previously written threshold voltage Vth is stored in the storage capacitor Cs, and this total voltage stored therein is applied between the gate G and the source S of the driving transistor Trd whereby the dependence of the output current Ids on the threshold voltage Vth is eliminated. The correction mechanism includes a first switching transistor Tr3 that turns on before the start of each horizontal scanning period (1H) thereby to reset the voltage across the storage capacitor Cs to a value greater than the threshold voltage Vth. The correction mechanism also includes a second switching transistor Tr4 that turns on in each horizontal scanning period (1H) thereby to charge the storage capacitor Cs until the voltage across the storage capacitor Cs becomes equal to the threshold voltage Vth. In the signal supply period, in the horizontal scanning period (1H), in which the signal line SL is at the potential of the image signal Vsig, the sampling transistor Tr1 samples the image signal Vsig supplied via the signal line SL at the storage capacitor Cs, while in the fixed signal period, in the horizontal scanning period (1H), in which the signal line SL is at the fixed potential Vss0, the threshold voltage Vth of the driving transistor Trd is detected and written in the storage capacitor Cs.

In the present comparative example, the output current Ids of the driving transistor Trd depends not only on the threshold voltage Vth but also on the carrier mobility μ of the channel region of the driving transistor. To handle the above-described dependence, the correction mechanism operates in the partial period of the horizontal scanning period (1H) such that the dependence of the output current Ids on the carrier mobility μ is eliminated by extracting the output current Ids of the driving transistor Trd when the image signal Vsig is being sampled, and negatively feeding the output current Ids back to the storage capacitor Cs thereby correcting the input voltage Vgs.

Figure 8:
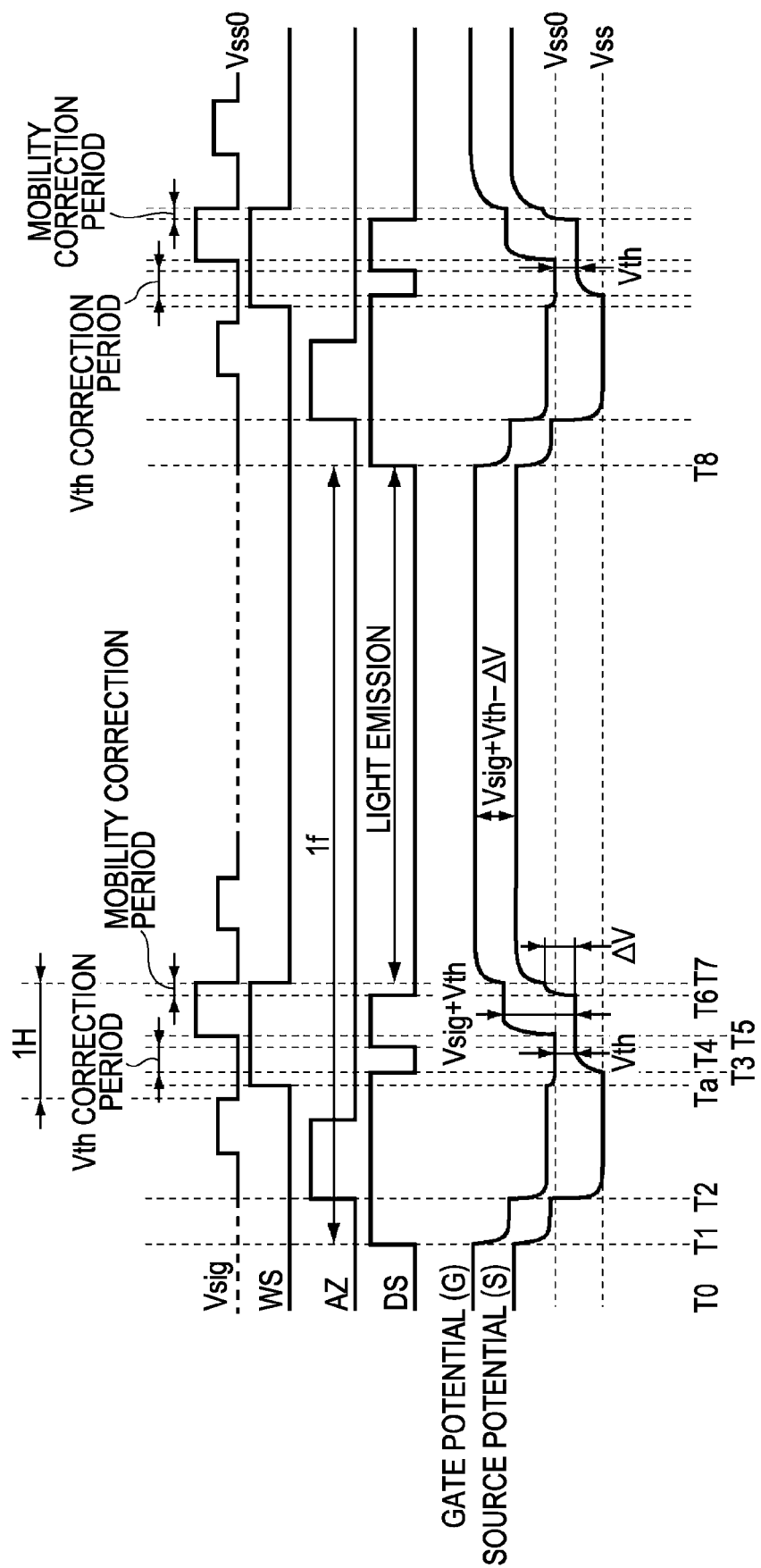
FIG. 8 is a timing chart provided for an explanation of an operation of the second comparative example of the display apparatus.

FIG. 8 is a timing chart provided for an explanation of the operation of the second comparative example of the circuit shown in FIG. 7. FIG. 8 illustrates waveforms, along time T, of control signals applied to the scanning lines WS, AZ, and DS. For simplicity, the control signals are denoted by the same symbols as those denoting the scanning lines. In FIG. 8, the waveform of the image signal Vsig applied to the signal line is also shown along the time axis T. As shown in FIG. 8, the image signal Vsig has a fixed potential value Vss0 in the first half of each horizontal scanning period H and has a signal potential in the second half. Because the transistors Tr1 and Tr3 are of the N-channel type, these transistors turn on when the scanning line WS or AZ is at the high level, while they turn off when the scanning line WS or AZ is at the low level. On the other hand, the P-channel type transistor Tr4 turns off when the scanning line DS is at the high level and turns on when the scanning line DS is at the low level. In the timing chart of FIG. 8, in addition to the waveforms of the control signals WS, AZ, and DS and the waveform of the image signal Vsig, changes in voltages of the gate G and the source S of the driving transistor Trd are also shown.

In the timing chart shown in FIG. 8, a period from time T1 to time T8 corresponds to one field (1f) in which the rows of the pixel array are sequentially scanned once. Note that in the timing chart, the waveforms of the control signals WS, AZ, and DS applied to pixels are shown only for one row.

At time T0 before the start of the field, the control lines WS, AZ, and DS are all at the low level. Therefore, the N-channel transistors Tr1 and Tr3 are in the off-state, and the P-channel transistor Tr4 is in the on-state. Thus, the driving transistor Trd is electrically connected to the power supply Vcc via the transistor Tr4 being in the on-state, and the output current Ids depending on the input voltage Vgs is supplied to the light emitting element EL. Thus, at time T0, the light emitting element EL is emitting light. In this state, the input voltage Vgs applied to the driving transistor Trd is given by the difference between the gate potential (G) and the source potential (S).

At time T1 at which the field starts, the control signal DS rises up from the low level to the high level. As a result, the transistor Tr4 turns off, and the driving transistor Trd is electrically disconnected from the power supply Vcc. Thus, the emission of light is stopped, and the operation enters a non-light emission period. At time T1, all transistors Tr1, Tr3, and Tr4 turn off.

Thereafter, at time T2, the control signal AZ rises up from the low level to the high level. As a result, the switching transistor Tr3 turns on. Thus, the reference voltage Vss is applied to the other end of the storage capacitor Cs and to the source S of the driving transistor Trd. In this process, because the gate of the driving transistor Trd has a high impedance, the gate potential (G) also falls down with falling-down source potential (S).

Thereafter, the control signal AZ returns to the low level, and the switching transistor Tr3 turns off. At time Ta, the control signal WS rises up to the high level, and thus the sampling transistor Tr1 turns on. At this point of time, the signal line is at the fixed potential Vss0. Note that Vss0 and Vss are set such that Vss0−Vss>Vth is satisfied. Also note that Vss0−Vss is applied as the input voltage Vgs to the driving transistor Trd. Parameters are set such that Vgs>Vth is satisfied so as to make it possible to properly perform the Vth correction process in a following period. In other words, at time Ta, the voltage across the storage capacitor Cs is reset to a value greater than Vgs before the Vth correction process starts. Furthermore, when the threshold voltage of the light emitting element EL is denoted by VthEL, Vss is set such that VthEL>Vss is satisfied, i.e., the light emitting element EL is reversely biased. The above settings are necessary to properly perform the following Vth correction process.

Thereafter, at time T3, the control signal DS is switched to the low level. As a result, the switching transistor Tr4 turns on and the Vth correction operation starts. To achieve high accuracy in the Vth correction process, the potential of the signal line is still maintained at the fixed potential Vss0. The turning-on of the switching transistor Tr4 causes the driving transistor Trd to be electrically connected to the power supply Vcc, and thus the output current Ids flows. As a result, the storage capacitor Cs is charged and the source potential (S) connected to one end of the storage capacitor Cs goes up. On the other hand, the potential of the other end of the storage capacitor Cs (i.e., the gate potential (G)) is fixed at Vss0. Thus, as the storage capacitor Cs is charged, the source potential (S) rises up, and the driving transistor Trd turns off when the input voltage Vgs reaches Vth. If the driving transistor Trd turns off, the source potential (S) thereof becomes equal to Vss0−Vth as shown in the timing chart.

Thereafter, at time T4, the control signal DS is returned to the high level to turn off the switching transistor Tr4. Thus, the Vth correction process is completed. As a result of the correction process, a voltage corresponding to the threshold voltage Vth is stored in the storage capacitor Cs.

After the completion of the Vth correction process in the period from time T3 to time T4, when the first half of the horizontal scanning period (1H) has elapsed, the potential of the signal line is switched from Vss0 to Vsig. As a result, the image signal Vsig is written in the storage capacitor Cs. The capacitance of the storage capacitor Cs is much smaller than the capacitance of the equivalent capacitance Coled of the light emitting element EL. Therefore, most part of the image signal Vsig is written in the storage capacitor Cs. Thus, the voltage Vgs between the gate G and the source S of the driving transistor Trd is given by Vth detected in the previous step plus the sampled voltage Vsig, i.e., Vsig+Vth. Thus, as shown in the timing chart of FIG. 8, the gate-source voltage Vgs is given by Vsig+Vth. The sampling of the image signal Vsig is continued until the control signal WS is returned to the low level at time T7. Thus, the period from T5 to T7 functions as the sampling period.

In the present comparative example, as described above, the Vth correction period from T3 to T4 and the sampling period from T5 to T7 are included in each horizontal scanning period (1H). Over each horizontal scanning period (1H), the sampling control signal WS is maintained at the high level. In the present comparative example, the Vth correction process and the writing of Vsig are performed in the state in which the sampling transistor Tr1 is in the on-state. This allows simplification of the pixel circuit 2.

In the present comparative example, in addition to the Vth correction process, the correction associated with the mobility μ is also performed. However, the configuration is not limited to that described above. For example, the correction may be made only with respect to Vth without performing the correction with respect to the mobility μ. Furthermore, in the present comparative example of the pixel circuit 2, a mixture of N-channel and P-channel transistors is used for the transistors. Alternatively, the transistor other than the driving transistor Trd may all be of the N-channel type or may all be of the P-channel type.

The correction associated with the mobility μ is performed in the period from T6 to T7 as described in further detail below. At time T6 before time T7 at which the sampling period ends, the control signal DS falls down to the low level. As a result, the switching transistor Tr4 turns on. Thus, the driving transistor Trd is electrically connected to the power supply Vcc, and the pixel circuit proceeds from the non-light emission period to a light emission period. In the period from T6 to T7 in which the sampling transistor Tr1 is still in the on-state and the switching transistor Tr4 is turned on, the correction is made as to the carrier mobility of the driving transistor Trd. That is, in the present comparative example, the carrier mobility correction is performed in the period from T6 to T7 in which a tail part of the sampling period overlaps a beginning part of the light emission period. In the beginning part of the light emission period in which the correction associated with the mobility is performed, the light emitting element EL is reversely biased and thus no light is emitted. In the mobility correction period from T6 to T7, the drain current Ids flows through the driving transistor Trd in the state in which the gate G of the driving transistor Trd is fixed at the level corresponding to the image signal Vsig. In this state, parameters are set such that Vss0−Vth<VthEL is satisfied so that the light emitting element EL is reversely biased, and thus the light emitting element EL functions not as a diode but as a capacitor. Thus, the current Ids passing through the driving transistor Trd is written into the total capacitor of the storage capacitor Cs and the equivalent capacitor Coled. As a result, the source potential (S) of the driving transistor Trd rises up. In the timing chart shown in FIG. 8, the increase in the source potential is denoted by ΔV. The gate-source voltage Vgs stored in the storage capacitor Cs is reduced by the increase in the source potential ΔV, and thus negative feedback occurs. As a result of the negative feedback of the output current Ids of the driving transistor Trd to the input voltage Vgs of the driving transistor Trd, the correction associated with the mobility μ is performed. The amount of the negative feedback ΔV can be optimized by adjusting the length t of the mobility correction period from T6 to T7.

At time T7, the control signal WS falls down to the low level, and thus the sampling transistor Tr1 turns off. As a result, the gate G of the driving transistor Trd is disconnected from the signal line SL. Thus, the image signal Vsig is no longer applied to the gate G of the driving transistor Trd, and the gate potential (G) of the driving transistor Trd rises up with the source potential (S). In this transition process, the gate-source voltage Vgs is maintained at the voltage stored in the storage capacitor Cs, i.e., (Vsig−ΔV+Vth). As a result of the increase in the source potential (S), the bias of the light emitting element EL is switched from the reverse bias to the forward bias, and the output current Ids flows through the light emitting element EL. Thus, the light emitting element EL starts emitting light. In this state, the dependence of the drain current Ids on the gate voltage Vgs can be obtained by substituting Vsig−ΔV+Vth into Vgs in the transistor characteristic equation described above, that is, the output current Id is given by $$Ids = k\mu(Vgs-Vth)^2 = k\mu(Vsig-\Delta V)^2$$

where $$k = (1/2)(W/L)Cox$$

As can be seen from the above equation, the resultant output current Ids no longer includes a term of Vth, that is, the output current Ids supplied to the light emitting element EL does not depend on the threshold voltage Vth of the driving transistor Trd. Thus, the drain current Ids is basically determined by the signal voltage Vsig of the image signal. In other words, the light emitting element EL emits light with intensity corresponding to the image signal Vsig corrected by the feedback ΔV. The amount of correction value ΔV is determined so as to eliminate the effect of the mobility μ in the coefficient of the characteristic equation. As a result, the drain current Ids depends only on the image signal Vsig.

Finally, at time T8, the control signal DS rises up to the high level, and the switching transistor Tr4 turns off. As a result, light emission is stopped, and the present field ends. Thereafter, a next field is subjected to the similar operation including the Vth correction process, the mobility correction process, and the light emission process.

Figure 9:
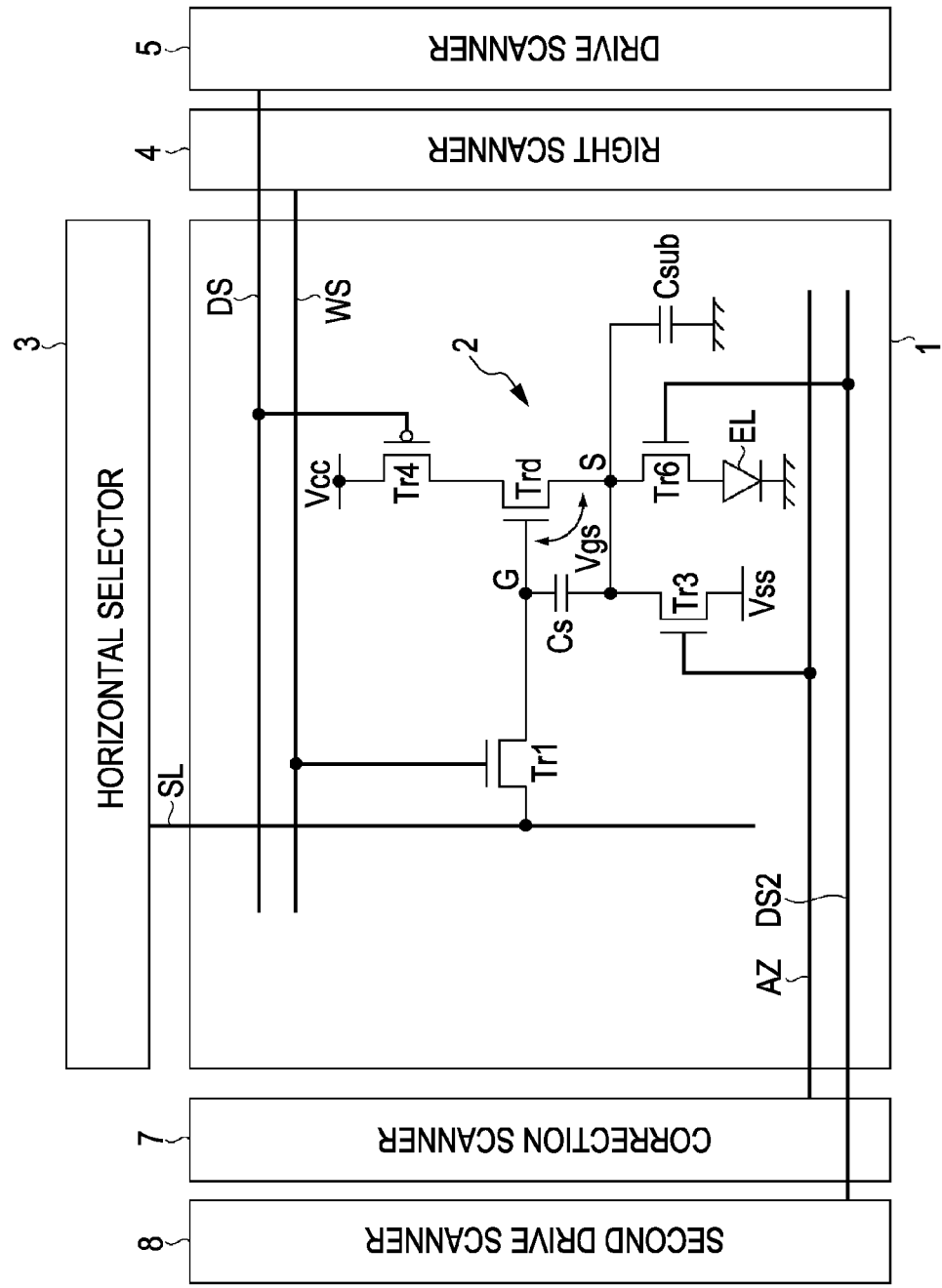
FIG. 9 is circuit diagram illustrating a display apparatus according a second embodiment of the present invention.

FIG. 9 is a circuit diagram of a display apparatus according to a second embodiment of the present invention. This display apparatus is configured in a basically similar manner to the second comparative example shown in FIG. 7. In FIG. 9, similar parts to those in FIG. 7 are denoted by similar reference symbols. The display apparatus according to the second embodiment of the invention is different from the second comparative example shown in FIG. 7 in that a switching transistor Tr6 is disposed between the source S of the driving transistor Trd and the anode of the light emitting element EL. Furthermore, the equivalent capacitor Coled of the light emitting element EL is removed, and an auxiliary capacitor Csub is connected between the source S of the driving transistor Trd and a ground line. To drive the gate of the switching transistor Tr6, additional scanning lines DS2 are disposed in the pixel array 1. The scanning lines DS2 are sequentially scanned line by line by a second drive scanner 8 disposed in a driving unit.

Figure 10:
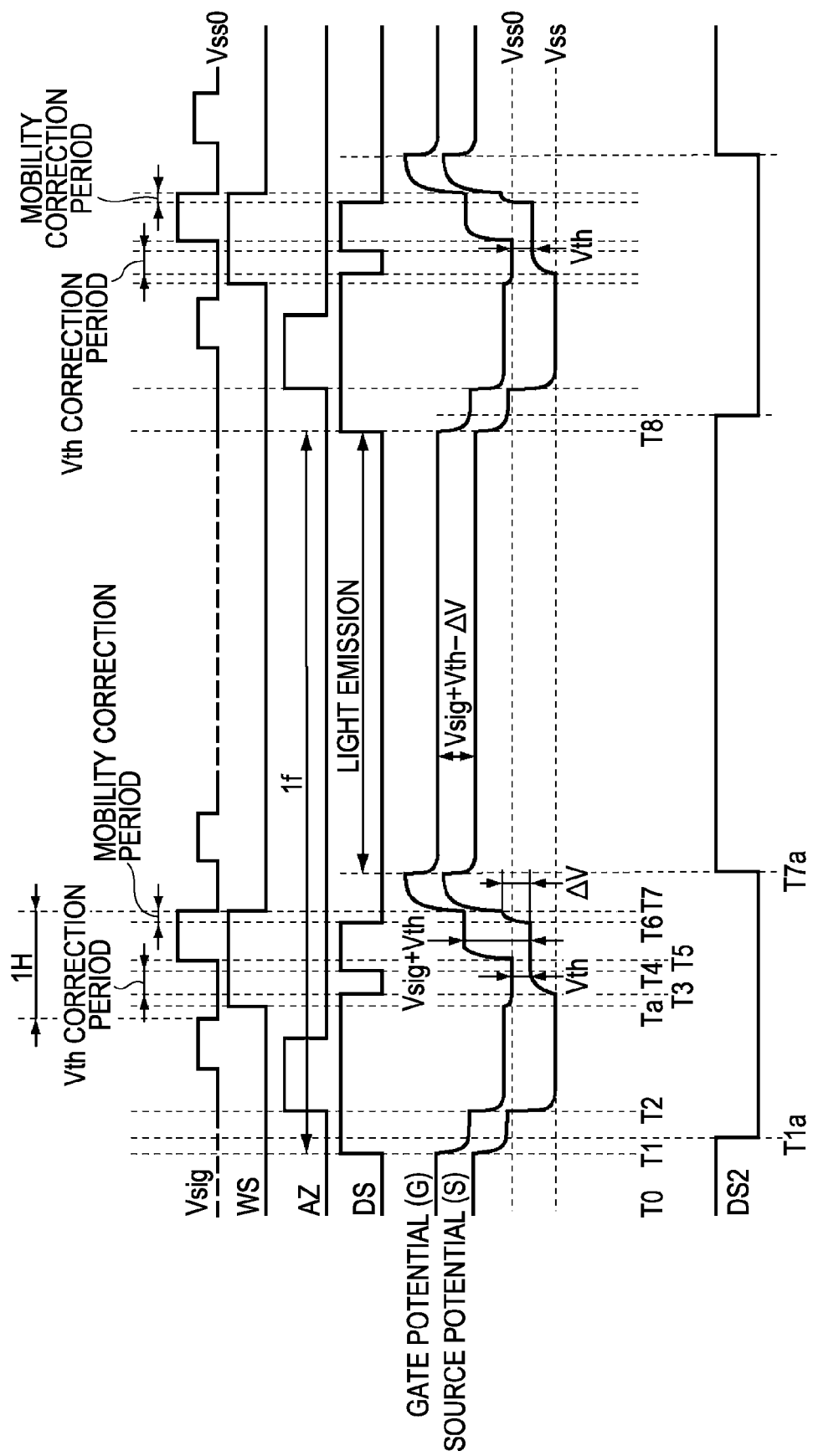
FIG. 10 is timing chart provided for an explanation of an operation of the display apparatus according to the second embodiment of the present invention.

FIG. 10 is a timing chart provided for an explanation of the operation of the circuit according to the second embodiment shown in FIG. 9. In FIG. 6, for ease of understanding, similar reference symbols to those in the timing chart shown in FIG. 8 are used. As shown in FIG. 10, at time T1, the switching transistor Tr4 is turned off to switch the pixel 2 from the light emission state into the non-light emission state. Thereafter, at time T1a, the scanning line DS2 is switched to the low level to turn off the switching transistor Tr6. As a result, the light emitting element EL is electrically disconnected from the driving transistor Trd. Thereafter, in a period from T2 to T3, a preliminary process is performed. Furthermore, in a period from T3 to T4, the threshold voltage correction process is performed. In a period from T5 to T7, the image signal is written in the storage capacitor Cs. In this process, the mobility correction is performed in a period from T6 to T7. In these processes, the light emitting element EL is electrically disconnected from the driving transistor Trd, thereby eliminating the effects of the leakage current of the light emitting element EL.

If all correction processes are completed at time T7, then at time T7a, the control signal DS2 is returned to the high level to turn on the switching transistor Tr6. As a result, the light emitting element EL is electrically connected to the driving transistor Trd. Thus the output current Ids is supplied to the light emitting element EL, and the light emitting element EL starts emitting light. As a result, the potential of the source S, which determines the operating point of the driving transistor Trd and the light emitting element EL, falls down from the power supply potential Vcc to a lower level and settles there. In response to the falling of the source potential, the potential of the gate G of the driving transistor Trd also falls down to a lower level and settles there.

Figure 11:
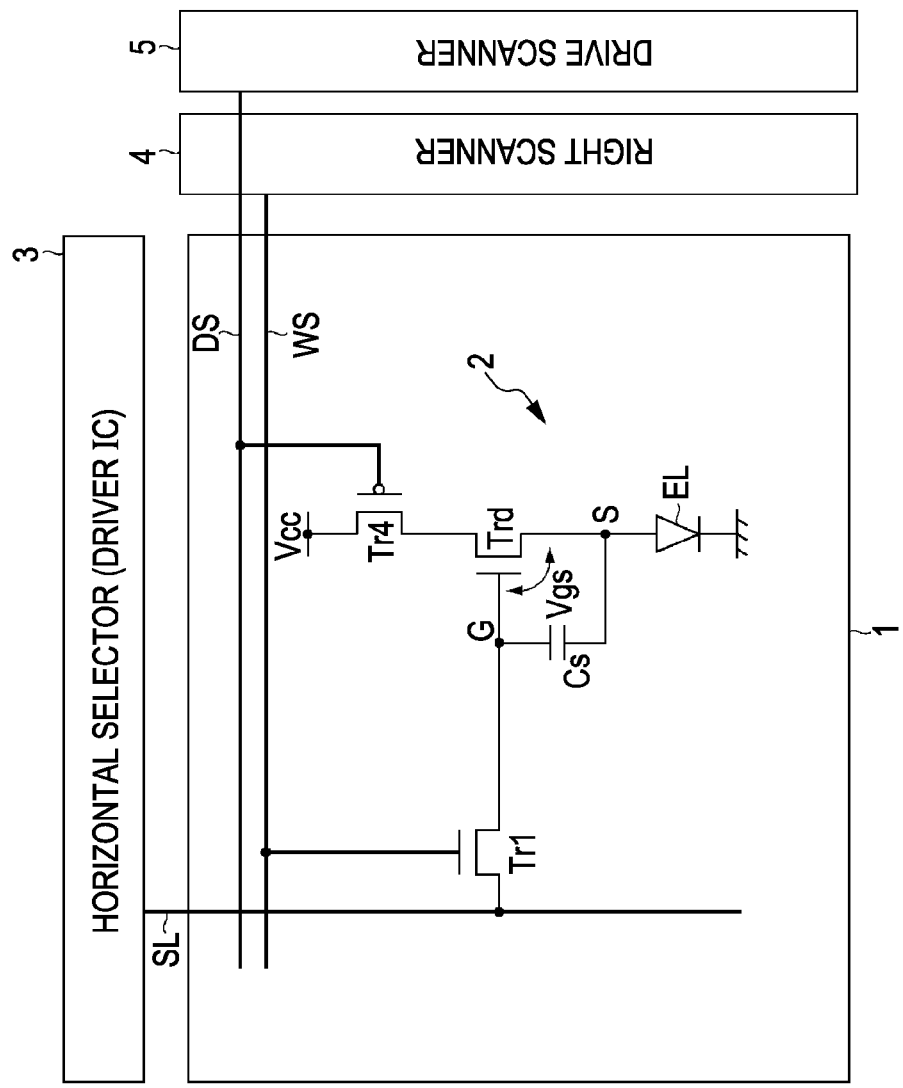
FIG. 11 is a circuit diagram of a third comparative example of a display apparatus.

FIG. 11 is a circuit diagram of a third comparative example of a display apparatus. In this third comparative example, each pixel circuit 2 is composed of three transistors, one light emitting element, and one storage capacitor. Note that in this third comparative example, the number of transistors is further reduced by one from that used in the second comparative example. The pixel circuit 2 includes a sampling transistor Tr1, a storage capacitor Cs connected to the sampling transistor Tr1, a driving transistor Trd connected to the storage capacitor Cs, a light emitting element EL connected to the driving transistor Trd, and a switching transistor Tr4 for connecting/disconnecting the driving transistor Trd to/from the power supply Vcc.

The sampling transistor Tr1 turns on in response to the control signal WS supplied via the first scanning line WS and samples the image signal Vsig supplied via the signal line SL at the storage capacitor Cs. The image signal Vsig sampled in the storage capacitor Cs is applied as an input voltage Vgs to the gate G of the driving transistor Trd. The driving transistor Trd supplies an output current Ids corresponding to the input voltage Vgs to the light emitting element EL. Note that the output current Ids depends on the threshold voltage Vth of the driving transistor Trd. The light emitting element EL is driven by the output current Ids supplied from the driving transistor Trd and emits light with intensity corresponding to the supplied image signal Vsig. The switching transistor Tr4 turns on in response to the control signal DS supplied via the second scanning line DS to connect the driving transistor Trd to the power supply Vcc during the light emission period. In the non-light emission period, the switching transistor Tr4 turns off to electrically disconnect the driving transistor Trd from the power supply Vcc.

A scanner unit including a write scanner 4 and a drive scanner 5 outputs control signals WS and DS over the first and second scanning lines WS and DS during each horizontal scanning period (1H) to properly turn on/off the sampling transistor Tr1 and the switching transistor Tr4 so as to perform the preliminary process, the correction process, and the sampling process. In the preliminary process, the storage capacitor Cs is reset in preparation for the following correction process to eliminate the effects of the dependence of the output current Ids on the threshold voltage Vth. In the correction process, a voltage for eliminating the effects of the threshold voltage Vth is written in the storage capacitor Cs in the reset state. In the sampling process after the correction process, the signal potential of the image signal Vsig is sampled into the storage capacitor Cs subjected to the correction process. On the other hand, a signal unit including a horizontal selector (driver IC) 3 switches the potential of the image signal among a fixed first potential VssH, second fixed potential VssL, and a signal potential Vsig in each horizontal period (1H) thereby to provide, via the signal line SL, various potentials for use in the preliminary process, the correction process, and the sampling process.

More specifically, the horizontal selector 3 first supplies the first fixed potential VssH with a high level and then switches the potential to the second fixed potential VssL with a low level thereby allowing the preliminary process to be performed. In the state in which the second fixed low potential VssL is maintained, the preliminary process is performed. Thereafter, the potential is switched to the signal potential Vsig, and the sampling process is performed. As described above, the horizontal selector 3 is formed using the driving IC including a signal generator adapted to generate the signal potential Vsig, and an output circuit adapted to insert the first fixed potential VssH and the second fixed potential VssL in the signal potential Vsig output from the signal generator thereby converting the image signal into a form in which the first fixed potential VssH, the second fixed potential VssL, and the signal potential Vsig appear in turn, and output the resultant converted image signal over the respective signal lines SL.

The output current Ids of the driving transistor Trd depends not only on the threshold voltage Vth but also on the carrier mobility μ of the channel region of the driving transistor. Thus, the scanner unit including the write scanner 4 and the drive scanner 5 outputs the control signal over the second scanning line DS in the horizontal scanning period (1H) to control the switching transistor Tr4 to allow the correction process to be performed such that when the image signal Vsig is being sampled, the output current Ids of the driving transistor Trd is extracted and negatively fed back to the storage capacitor Cs thereby correcting the input voltage Vgs so as to delete the effects of the dependence of the output current Ids on the carrier mobility μ.

Figure 12:
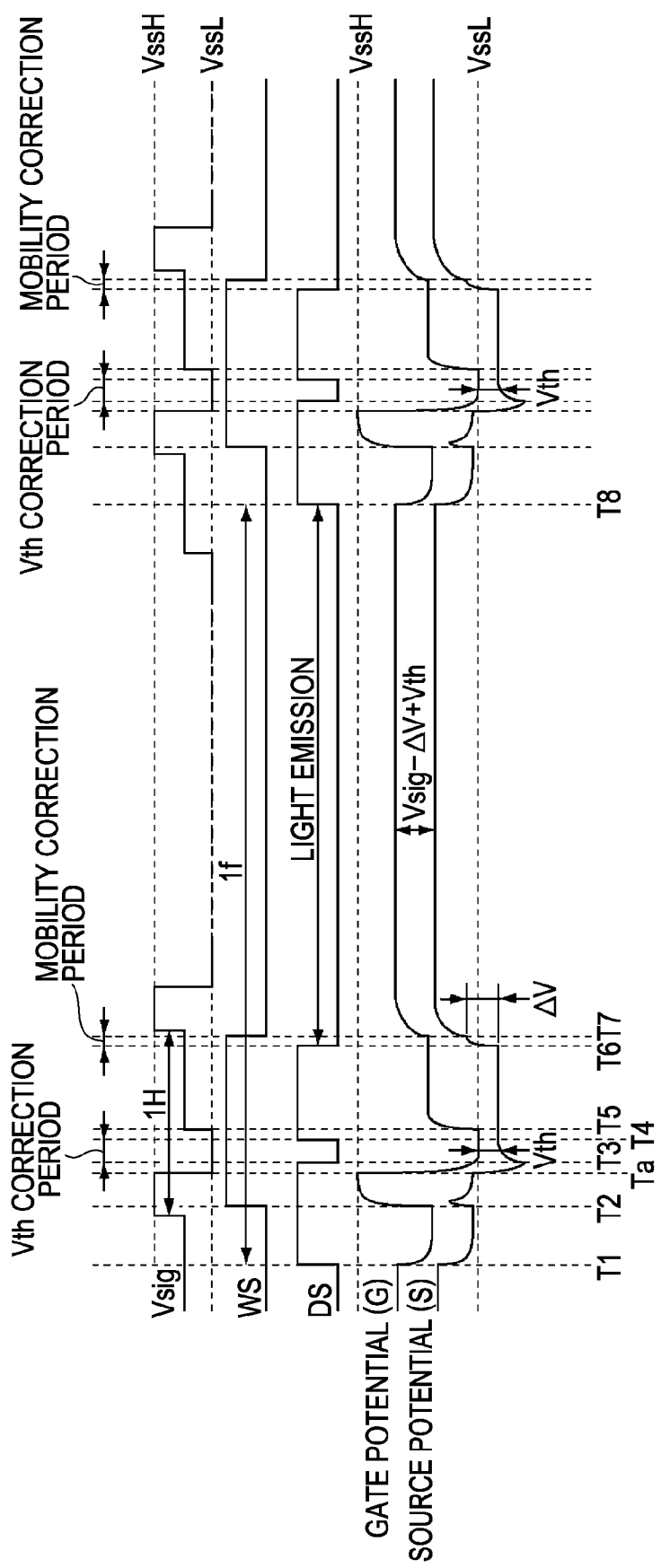
FIG. 12 is a timing chart provided for an explanation of an operation of the third comparative example of the display apparatus.

FIG. 12 is a timing chart provided for an explanation of the operation of the third comparative example of the pixel circuit shown in FIG. 11. Referring to FIG. 12, the operation of the pixel circuit shown in FIG. 11 is described below. FIG. 12 illustrates waveforms, along time T, of control signals applied to the scanning lines WS and DS. For simplicity, the control signals are denoted by the same symbols as those denoting the scanning lines. In FIG. 12, the waveform of the image signal Vsig applied to the signal line is also shown along the time axis T. As shown in FIG. 12, the potential of the image signal is sequentially switched among the first fixed potential VssH, the second fixed potential VssL, and the signal potential Vsig. Because the transistor Tr1 is of the N-channel type, it turns on when the scanning line WS is at the high level while it turns off when the scanning line WS is at the low level. On the other hand, the P-channel type transistor Tr4 turns off when the scanning line DS is at the high level and turns on when the scanning line DS is at the low level. In the timing chart of FIG. 12, in addition to the waveforms of the control signals WS and DS and the waveform of the image signal, changes in voltages of the gate G and the source S of the driving transistor Trd are also shown.

In the timing chart shown in FIG. 12, a period from time T1 to time T8 corresponds to one field (1f) in which the rows of the pixel array are sequentially scanned once. Note that in the timing chart, the waveforms of the control signals WS and DS applied to pixels are shown only for one row.

First, at time T1, the switching transistor Tr4 is turned off such that no light is emitted. In this state, no power is supplied from Vcc, and thus the source voltage of the driving transistor Trd falls down to the cut-off voltage VthEL of the light emitting element EL.

Thereafter, at time T2, the sampling transistor Tr1 is turned on. It is desirable that before the sampling transistor Tr1 is turned on, the signal line be raised to VssH, because this will reduce the writing time. The turning-on of the sampling transistor Tr1 causes VssH to be written at the gate of the driving transistor Trd. In this process, the voltage applied to the gate is coupled to the source via the storage capacitor Cs, and thus the source potential rises up. However, the rising of the potential of the source S is temporary. That is, the storage capacitor Cs is discharged via the light emitting element EL and the source potential falls down VthEL. During this transition, the gate voltage remains at VssH.

Thereafter, at time Ta, the signal voltage is switched to VssL while maintaining the sampling transistor Tr1 in the on-state. This voltage change is coupled to the source potential via the storage capacitor C. The amount coupling is given by Cs/(Cs+Coled)×(VssH−VssL) where the gate potential is given by VssL and the source potential is given by VthEL−Cs/(Cs+Coled)×(VssH−VssL). Because of negative biasing, the source voltage is lower than VthEL and thus the light emitting element EL turns off. Herein it is desirable that the source potential be set to a value which causes the light emitting element EL to remain in the off-state even in the following Vth correction process and the mobility correction process. By performing the coupling such that Vgs>Vth, it becomes possible to properly perform the Vth correction process in a following period. Thus, in the present circuit configuration including a less number of elements such as transistor, power supply lines, and gate lines, it is also possible to properly perform the preliminary process for preparation for the Vth correction process. That is, the period from T2 to Ta is included in the preliminary period for preparation for the correction process.

Thereafter, at time T3, the switching transistor Tr4 is turned on while maintaining the gate G at VssL. As a result, a current flows through the driving transistor Trd, and the Vth correction process is performed in a similar manner to the comparative examples. The current flows until the driving transistor Trd turns off. If the driving transistor Trd turns off, the source potential of the driving transistor Trd becomes equal to VssL−Vth. Herein, it is necessary that VssL−Vth<VthEL is satisfied.

Thereafter, at time T4, the switching transistor Tr4 is turned off. Thus, the Vth correction process is completed. As described above, the period from T3 to T4 functions as the Vth correction period.

After the completion of the Vth correction process in the period from time T3 to time T4, at time T5, the potential of the signal line is switched from VssL to Vsig. As a result, the signal potential of the image signal Vsig is written in the storage capacitor Cs. The capacitance of the storage capacitor Cs is much smaller than the capacitance of the equivalent capacitance Coled of the light emitting element EL. Therefore, most of the signal potential Vsig is written in the storage capacitor Cs. Thus, the voltage Vgs between the gate G and the source S of the driving transistor Trd is given by Vth detected in the previous step plus the sampled voltage Vsig, i.e., Vsig+Vth. That is, the input voltage Vgs equal to Vsig+Vth is applied to the driving transistor Trd. The sampling of the signal voltage Vsig is continued until the control signal WS is returned to the low level at time T7. Thus, the period from T5 to T7 functions as the sampling period.

In the present comparative example of the pixel circuit, in addition to the Vth correction process, the correction process associated with the mobility μ is also performed. The correction associated with the mobility μ is performed in the period from T6 to T7 As shown in the timing chart, a correction voltage ΔV is subtracted from the input voltage Vgs.

At time T7, the control signal WS falls down to the low level, and thus the sampling transistor Tr1 turns off. As a result, the gate G of the driving transistor Trd is disconnected from the signal line SL. Thus, the image signal Vsig is no longer applied to the gate G of the driving transistor Trd, and the gate potential (G) of the driving transistor Trd rises up with the source potential (S). In this transition process, the gate-source voltage Vgs is maintained at the voltage stored in the storage capacitor Cs, i.e., (Vsig−ΔV+Vth). As a result of the increase in the source potential (S), the bias of the light emitting element EL is switched from the reverse bias to the forward bias, and the output current Ids flows into the light emitting element EL. Thus, the light emitting element EL starts emitting light.

Finally, at time T8, the control signal DS rises up to the high level, and the switching transistor Tr4 turns off. As a result, light emission is stopped, and the present field ends. Thereafter, a next field is subjected to the similar operation including the preliminary process, the Vth correction process, the mobility correction process, and the light emission process.

Figure 13:
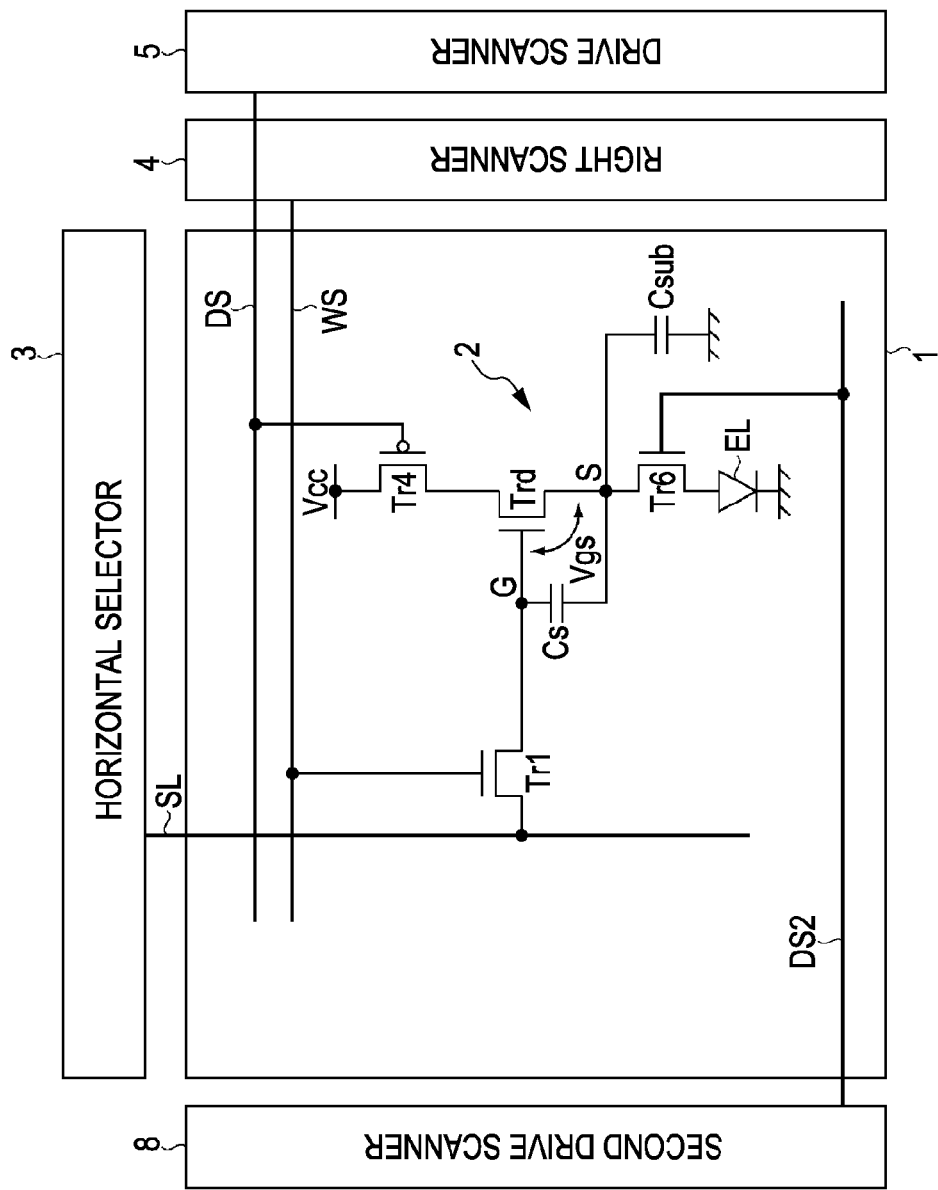
FIG. 13 is circuit diagram illustrating a display apparatus according a third embodiment of the present invention.

FIG. 13 is a circuit diagram of a display apparatus according to a third embodiment of the present invention. This display apparatus is configured in a basically similar manner to the third comparative example shown in FIG. 11. In FIG. 13, similar parts to those in FIG. 11 are denoted by similar reference symbols. The display apparatus according to the third embodiment of the invention is different from the third comparative example in that an additional switching transistor Tr6 is disposed between the driving transistor Trd and the light emitting element EL. Furthermore, the equivalent capacitor Coled of the light emitting element EL is removed, and an auxiliary capacitor Csub is connected between the source S of the driving transistor Trd and a ground line. To control turning-on/off of the gate of the switching transistor Tr6, additional scanning lines DS2 are disposed. The scanning lines DS2 are sequentially scanned line by line by a second drive scanner 8 additionally disposed in a driving unit.

Figure 14:
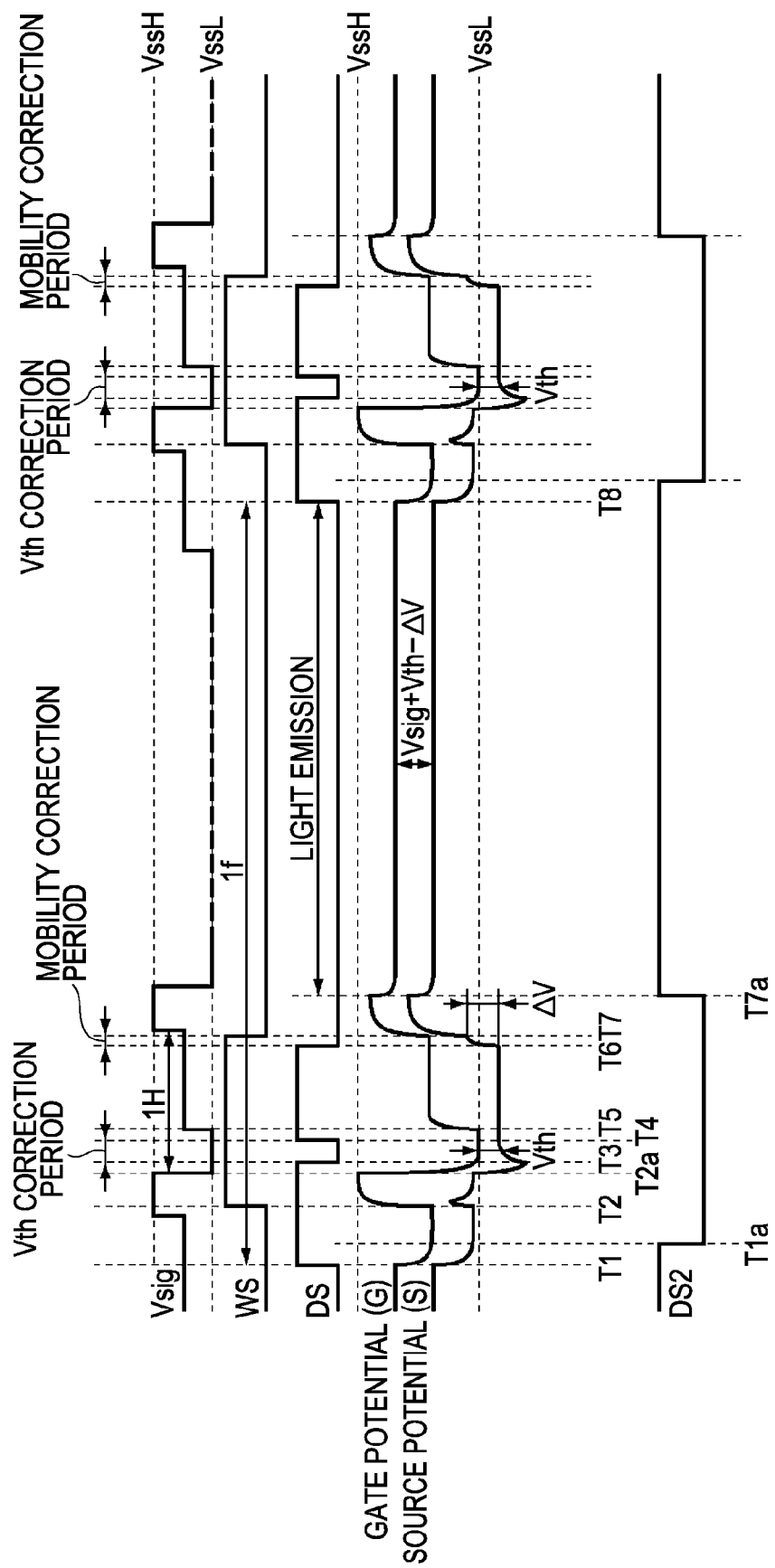
FIG. 14 is timing chart provided for an explanation of an operation of the display apparatus according to the third embodiment of the present invention.

FIG. 14 is a timing chart provided for an explanation of the operation of the pixel circuit according to the third embodiment shown in FIG. 13. This timing chart is basically similar to that shown in FIG. 12 and similar parts to those in FIG. 12 are denoted by similar reference symbols. As shown in FIG. 14, at time T1, the switching transistor Tr4 is turned off, and thus the non-light emission period starts. At time T1a, the switching transistor Tr6 is turned off thereby electrically disconnecting the light emitting element EL from the driving transistor Trd. Note that the turning-off of the switching transistors Tr4 and Tr6 may be performed in the reverse order. Thereafter, the threshold voltage correction process, the image signal sampling process, and the mobility correction process are sequentially performed. Then, at time T7, the sampling transistor Tr1 is turned off to disconnect the gate G of the driving transistor Trd from the signal line SL. Thus, the preliminary process, the correction processes, and the sampling process are all completed, and it is now ready to perform the light emission process. Note that in the operation described above, the switching transistor Tr6 is maintained in the off-state, and the light emitting element EL is disconnected from the source S of the driving transistor Trd so that the leakage current of the light emitting element EL does not have adverse effects on the operation.

Thereafter, at time T7a, the switching transistor Tr6 again turns on, and thus the light emitting element EL is electrically connected to the driving transistor Trd. As a result, the driving current Ids flows from the power supply Vcc into the cathode via the light emitting element EL, and thus light emission starts. In the above process, the potential of the source S of the driving transistor Trd falls down from the power supply potential Vcc to the operating point of the light emitting element EL and settles there.

Figure 15:
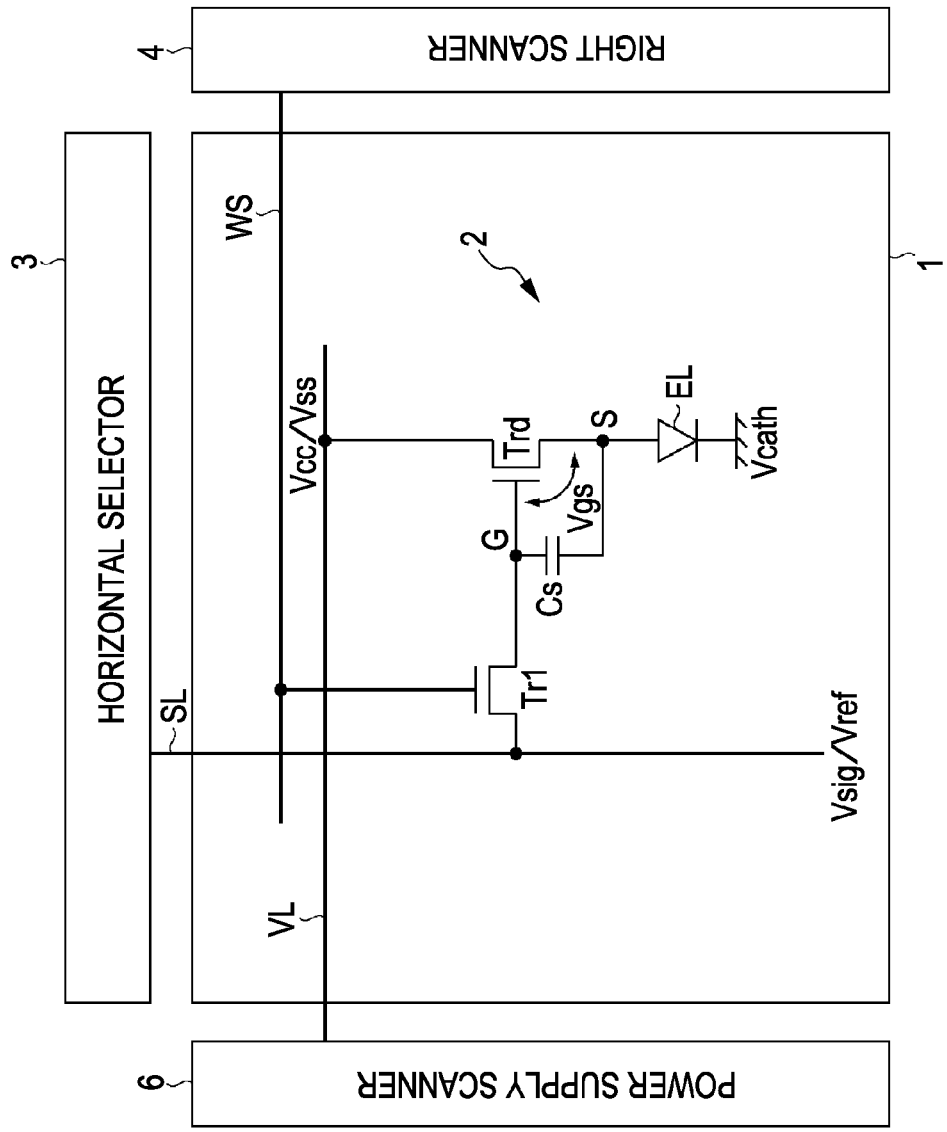
FIG. 15 is a circuit diagram of a fourth comparative example of a display apparatus.

FIG. 15 is a circuit diagram of a fourth comparative example of a display apparatus. In this fourth comparative example, each pixel circuit includes two transistors, one light emitting element, and one storage capacitor. Compared with the third comparative example described above, a further reduction in the number of transistors is achieved. As shown in FIG. 15, the pixel 2 includes a light emitting element EL such as an organic electroluminescent element, a sampling transistor Tr1, a driving transistor Trd, and a storage capacitor Cs. The control terminal (the gate) of the sampling transistor Tr1 is connected to a corresponding scanning line WS. One of current terminals (the source and the drain) of the sampling transistor Tr1 is connected to a corresponding signal line SL, and other one is connected to the control terminal (the gate) of the driving transistor Trd. One of current terminals (the source and the drain) of the driving transistor Trd is connected to the light emitting element EL, and the other one is connected to a corresponding power supply line VL. More specifically, in the present example, the driving transistor Trd is of the N-channel type, and thus the drain thereof is connected to the power supply line VL and the source S serving as an output node is connected to the anode of the light emitting element EL. The cathode of the light emitting element EL is connected to a cathode potential Vcath. The storage capacitor Cs is connected between the source S and the gate G of the driving transistor Trd.

In this configuration, the sampling transistor Tr1 turns on in response to the control signal supplied via the scanning line WS. As a result, the signal potential supplied via the signal line SL is sampled and stored in the storage capacitor Cs. The driving transistor Trd is supplied with a current from the power supply line VL at a first potential (high potential Vcc) and supplies a driving current, depending on the signal potential stored in the storage capacitor Cs, to the light emitting element EL. The write scanner 4 outputs a control signal with a predetermined pulse width over the control line WS thereby to turn on the sampling transistor Tr1 over a period in which the signal line SL is at the signal potential, whereby the signal potential is stored in the storage capacitor Cs, and the correction voltage for eliminating the effects of the mobility µ of the driving transistor Trd is added to the signal potential. Thereafter, the driving transistor Trd supplies the driving current, corresponding to the signal potential Vsig stored in the storage capacitor Cs, to the light emitting element EL, and thus the light emission starts.

In addition to the mobility correction function, the pixel circuit 2 also has a threshold voltage correction function. More specifically, at a first point of time before the sampling transistor Tr1 performs the sampling of the signal potential Vsig, a power scanner 6 switches the potential of the power supply line VL from the first potential (high potential Vcc) to a second potential (low potential) Vss. At a second point of time before the sampling transistor Tr1 performs the sampling of the signal potential Vsig, the write scanner 4 turns on the sampling transistor Tr1 whereby a reference potential Vref is applied from the signal line SL to the gate G of the driving transistor Trd and the source S of the driving transistor Trd is set at the second potential (Vss). At a third point of time after the second point of time, the power scanner 6 switches the potential of the power supply line VL from the second potential Vss to the first potential Vcc whereby a voltage corresponding to the threshold voltage Vth of the driving transistor Trd is stored in the storage capacitor Cs. As a result of the threshold voltage correction process described above, the effects of the pixel-to-pixel variation in the threshold voltage Vth of the driving transistor Trd are eliminated.

The pixel circuit 2 also has a bootstrap function. More specifically, at a time at which the signal potential Vsig has been stored in the storage capacitor Cs, the write scanner 4 removes the application of the control signal to the scanning line WS thereby to turn off the sampling transistor Tr1 and electrically disconnect the gate G of the driving transistor Trd from the signal line SL whereby the potential of the gate G of the driving transistor Trd changes with the change in potential of the source S and thus the voltage Vgs between the gate G and the source S is maintained constant.

Figure 16:
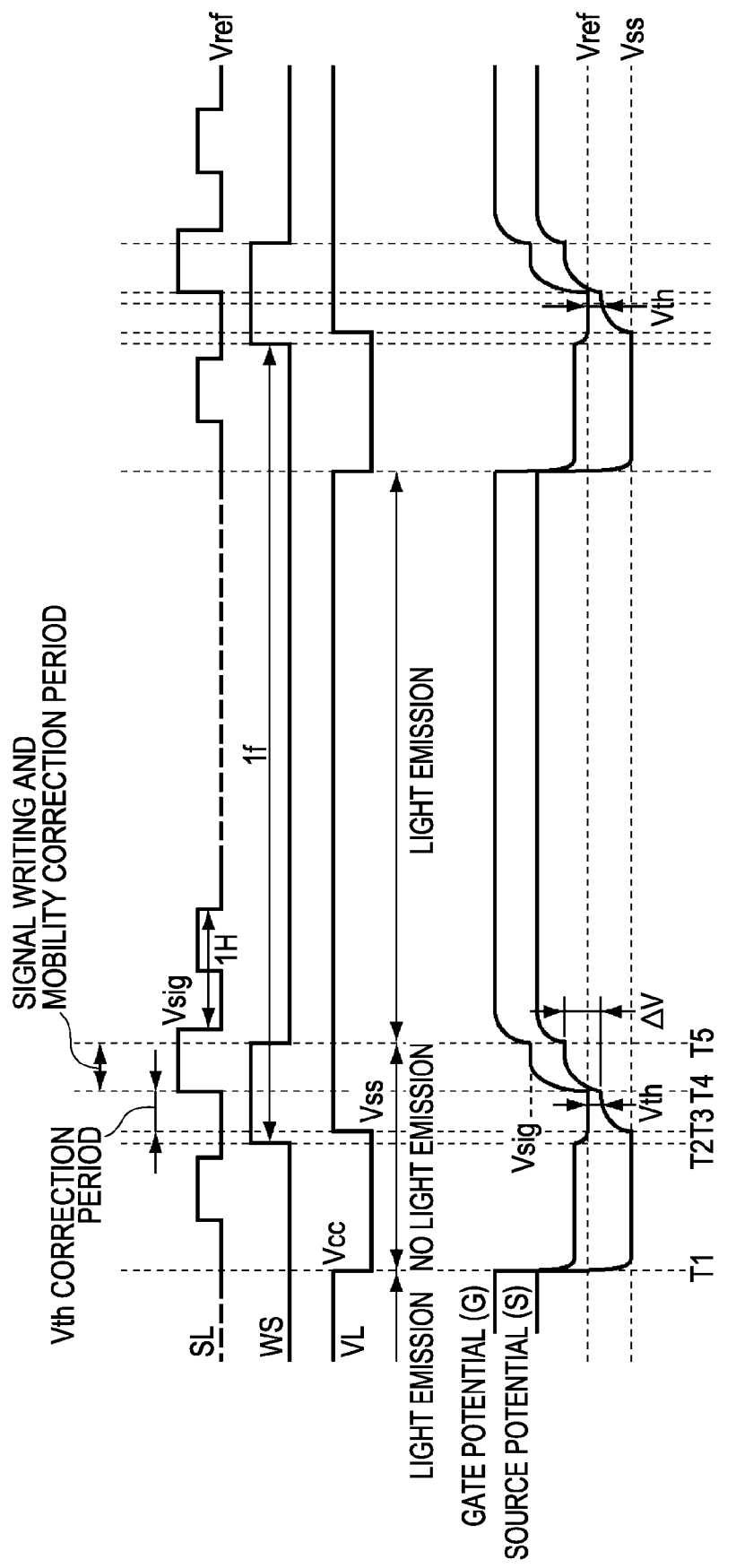
FIG. 16 is a timing chart provided for an explanation of an operation of the fourth comparative example of the display apparatus.

FIG. 16 is a timing chart provided for an explanation of the operation of the fourth comparative example of the pixel circuit shown in FIG. 15. In FIG. 16, changes in potentials of the scanning line WS, the power supply line VL, and the signal line SL along a common time axis are shown. In addition to these potential changes, changes in potentials of the gate G and the source S of the driving transistor are also shown. As described above, the control pulse signal for turning on the sampling transistor Tr1 is applied to the scanning line WS. This control pulse signal is periodically applied to the scanning line WS at a repetition interval corresponding to one field (1f) in synchronization with the line-by-line scanning of the pixel array. The potential of the power supply line VL is periodically switched between the high potential Vcc and the low potential Vss at the interval corresponding to one field. An image signal is supplied to the signal line SL such that the potential of image signal is switched between the signal potential Vsig and the reference potential Vref in each horizontal period (1H).

As shown in the timing chart of FIG. 16, after the end of a light emission period in a previous field, a non-light emission period in a present field starts. After the end of the non-light emission period, a light emission period in the present field starts. In the non-light emission period, the preliminary process, the threshold voltage correction process, the signal writing process, and the mobility correction process are performed.

In the light emission period in the previous field, the power supply line VL was at the high voltage Vcc and the driving current Ids was supplied from the driving transistor Trd to the light emitting element EL such that the driving current Ids flowed from the power supply line VL at the high potential Vcc into light emitting element EL via the driving transistor Trd and further into the cathode line.

At the start of the non-light emission period in the present field, first, at time T1, the potential of the power supply line VL is switched from the high potential Vcc to the low potential Vss such that the potential of the power supply line VL falls down to Vss and thus the potential of the source S of the driving transistor Trd falls down to Vss. As a result, the anode of the light emitting element EL (i.e., the source of the driving transistor Trd) is brought at a potential which causes the light emitting element EL to be reversely biased, and thus no driving current flows through the light emitting element EL and light emission stops. Furthermore, as the potential of the source S of the driving transistor falls down, the potential of the gate G falls down.

Thereafter, at time T2, the scanning line WS is switched from the low level to the high level thereby to turn on the sampling transistor Tr1. At this point of time, the signal line SL is at the reference potential Vref. As a result, the gate G of the driving transistor Trd is brought at the reference potential Vref of the signal line SL via the turned-on sampling transistor Tr1. In this state, the source S of the driving transistor Trd at the potential Vss that is sufficiently lower than Vref. Thus, the voltage Vgs between the gate G and the source S of the driving transistor Trd is reset to the value greater than the threshold voltage Vth of the driving transistor Trd. Thus, the period from T1 to T3 functions as the preliminary period in which the gate-source voltage Vgs of the driving transistor Trd is reset to the value greater than Vth.

Thereafter, at time T3, the power supply line VL is switched from the low potential Vss to the high potential Vcc and thus the potential of the source S of the driving transistor Trd starts to rise up. When the gate-source voltage Vgs of the driving transistor Trd reaches a value equal to the threshold voltage Vth, the driving transistor Trd turns off. Thus, the voltage corresponding to the threshold voltage Vth of the driving transistor Trd is written in the storage capacitor Cs thereby performing the correction associated with the threshold voltage. In this state, in order that all current flows into the storage capacitor Cs and no current flows through the light emitting element EL, the cathode potential Vcath is set to a value that causes the light emitting element EL to be in the off-state. The threshold voltage correction process described above is completed by time T4 at which the signal line SL is switched from Vref to Vsig. Thus, the period from T3 to T4 functions as the threshold voltage correction period.

At time T4, the signal line SL is switched from the reference potential Vref to the signal potential Vsig. At point of time, the sampling transistor Tr1 is still maintained in the on-state. Thus, the gate G of the driving transistor Trd is brought to the signal potential Vsig. In this state, because the light emitting element EL is in the cut-off state in which the light emitting element EL has a high impedance, the current flowing between the drain and source of the driving transistor Trd is all supplied into the storage capacitor Cs and the equivalent capacitance of the light emitting element EL, and thus the charging process starts. The potential of the source S of the driving transistor Trd rises up by KV by time T5 at which the sampling transistor Tr1 turns off. As a result, the signal potential Vsig of the image signal is added to Vth and the resultant total value is stored in the storage capacitor Cs and furthermore the voltage $\Delta V$ for the mobility correction is subtracted from the voltage stored in the storage capacitor Cs. Thus, the period from time T4 to time T5 functions as the signal writing/mobility correction period. In the signal writing period from T4 to T5, as described above, the writing of the signal potential Vsig and the adjustment of the correction amount $\Delta V$ are performed concurrently. The higher the signal potential Vsig, the greater the current Ids supplied by the driving transistor Trd and the greater the absolute value of $\Delta V$. Thus, the mobility correction is performed properly depending on the light emission intensity. For the same signal potential Vsig, the greater the mobility $\mu$ of the driving transistor Trd, the greater the absolute value of $\Delta V$. In other words, the greater the mobility $\mu$, the greater the amount $\Delta V$ of the negative feedback to the storage capacitor Cs, and thus the effects of the pixel-to-pixel variation in the mobility $\mu$ are eliminated.

Finally, at time T5, the potential of the scanning line WS is switched to the low level, and thus the sampling transistor Tr1 turns off. As a result, the gate G of the driving transistor Trd is disconnected from the signal line SL, and the drain current Ids starts to flow into the light emitting element EL. Thus, the anode potential of the light emitting element EL rises up depending on the driving current Ids. The rising of the anode potential of the light emitting element EL means that the potential of the source S of driving transistor Trd also rises up. As the potential of the source S of the driving transistor Trd, the potential of the gate G of the driving transistor Trd also rises up via the bootstrap operation of the storage capacitor Cs by the same amount as the increase in the source potential. Thus, the gate-source voltage Vgs of the driving transistor Trd is maintained constant during the light emission period. The value of Vgs is given by the sum of the signal potential Vsig and the threshold voltage Vth and the correction value associated with the mobility $\mu$.

Figure 17:
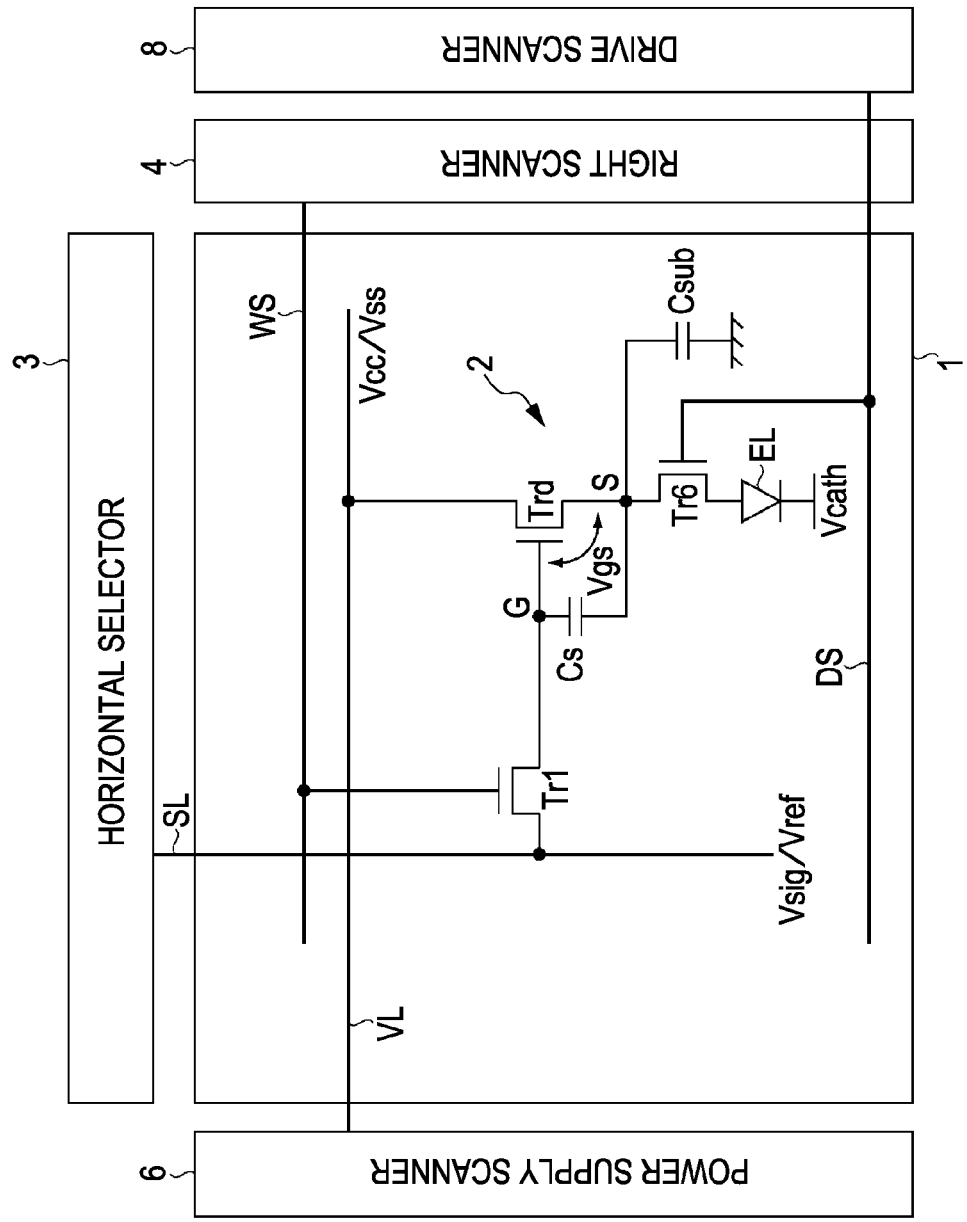
FIG. 17 is circuit diagram illustrating a display apparatus according a fourth embodiment of the present invention.

FIG. 17 is a circuit diagram of a display apparatus according to a fourth embodiment of the present invention. This display apparatus is configured in a basically similar manner to the fourth comparative example shown in FIG. 15. In FIG. 17, similar parts to those in FIG. 15 are denoted by similar reference symbols. The display apparatus according to the fourth embodiment of the invention is different from the fourth comparative example shown in FIG. 15 in that a switching transistor Tr6 is disposed between the source S of the driving transistor Trd and the anode of the light emitting element EL, and an auxiliary capacitor Csub is connected between the source S of the driving transistor Trd and a ground line. To drive the gate of the switching transistor Tr6, additional scanning lines DS extending parallel to the scanning lines WS are disposed. These additional scanning lines DS are sequentially scanned line by line by a drive scanner 8 disposed in a driving unit.

Figure 18:
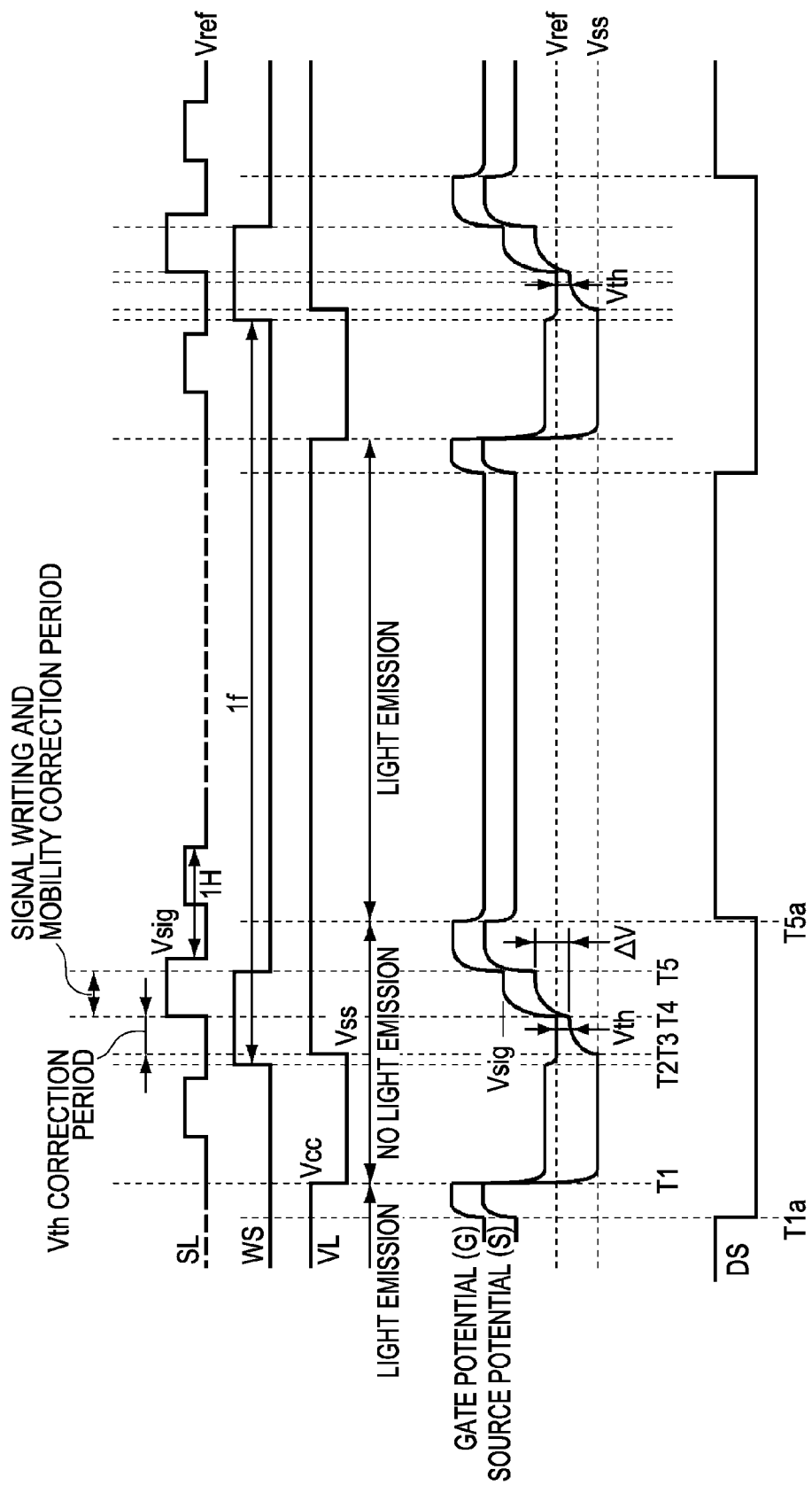
FIG. 18 is timing chart provided for an explanation of an operation of the display apparatus according to the fourth embodiment of the present invention.

FIG. 18 is a timing chart provided for an explanation of the operation of the pixel circuit according to the fourth embodiment shown in FIG. 17. This timing chart is basically similar to that shown in FIG. 16 and similar parts to those in FIG. 16 are denoted by similar reference symbols. First, at time T1a in a light emission period, the switching transistor Tr6 is turned off. As a result, the driving transistor Trd is electrically disconnected from the light emitting element EL, and a non-light emission period starts. At this point of time, the driving transistor Trd is still in the on-state, and thus the potential of the source S is pulled up to Vcc by the power supply line. As a result, the potential of the gate G of the driving transistor Trd also rises up.

Thereafter, in the state in which the light emitting element EL is electrically disconnected from the driving transistor Trd, the preliminary process for preparation for the correction, the threshold voltage correction process, the signal writing process, and the mobility correction process are performed. More specifically, at time T1, the power supply line VL is switched from Vcc to Vss to set the source potential of the driving transistor Trd to Vss. Furthermore, at time T2, the sampling transistor Tr1 is turned on while maintaining the signal line SL at the reference voltage Vref such that the gate potential of the driving transistor Trd is set to Vref. Thus, the preliminary process for preparation for the threshold voltage correction is completed. Thereafter, at time T3, the power supply line VL is switched from Vss to Vcc, and the storage capacitor Cs is charged until the driving transistor Trd turns off. As a result, the threshold voltage Vth is written in the storage capacitor Cs. Thereafter, at time T4, the signal line SL is switched to the signal potential Vsig, and the signal potential Vsig is written in the storage capacitor Cs. The writing process is continued until time T5. At time T5, the sampling transistor Tr1 is turned off. In the period from time T4 to time T5, in addition to the writing of the signal potential Vsig, the correction process is performed to eliminate the effects of the variation in the mobility $\mu$. At time T5, the sampling transistor Tr1 turns off, and the gate G of the driving transistor Trd is electrically disconnected from the signal line SL. Thus, the pixel circuit is in a state in which light can be emitted. In this state, because the driving transistor Trd is electrically disconnected from the light emitting element EL, the source potential of the driving transistor Trd is pulled up to the high potential Vcc supplied via the power supply line VL.

If the sampling transistor Tr1 turns off, then at time T5a, the switching transistor Tr6 is turned on to electrically connect the light emitting element EL to the driving transistor Trd. As a result, the driving current Ids flows from the power supply line VL into the light emitting element EL via the driving transistor Trd, and thus a light emission period starts.

Figure 19:
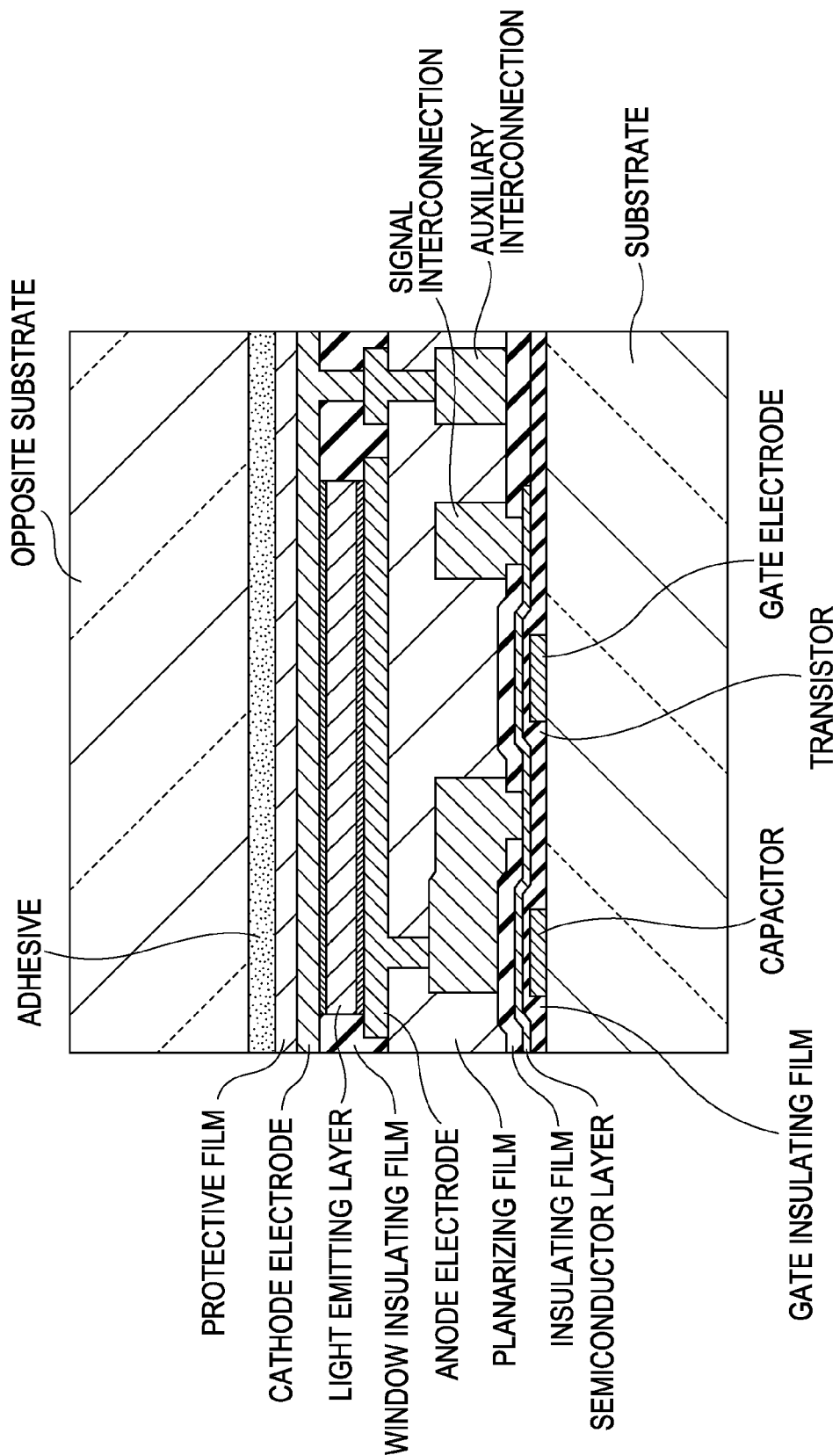
FIG. 19 is a cross-sectional view showing a device structure of a display apparatus according to an embodiment of the present invention.

FIG. 19 illustrates an example of a structure of a thin-film device used in the display apparatus according to the present invention. In this figure, a cross-sectional structure of a pixel formed on an insulating substrate is schematically shown. As shown in this figure, the pixel includes a plurality of thin-film transistors (only one thin-film transistor is shown in FIG. 19), a storage capacitor, and a light emission element such as an organic electroluminescent element. The transistors and the capacitor are formed in a lower layer on the substrate by using a TFT process, and the light emitting element (the organic electroluminescent element) is formed in an upper layer. A transparent opposite substrate is bonded thereto via an adhesive thereby forming a flat panel.

Figure 20:
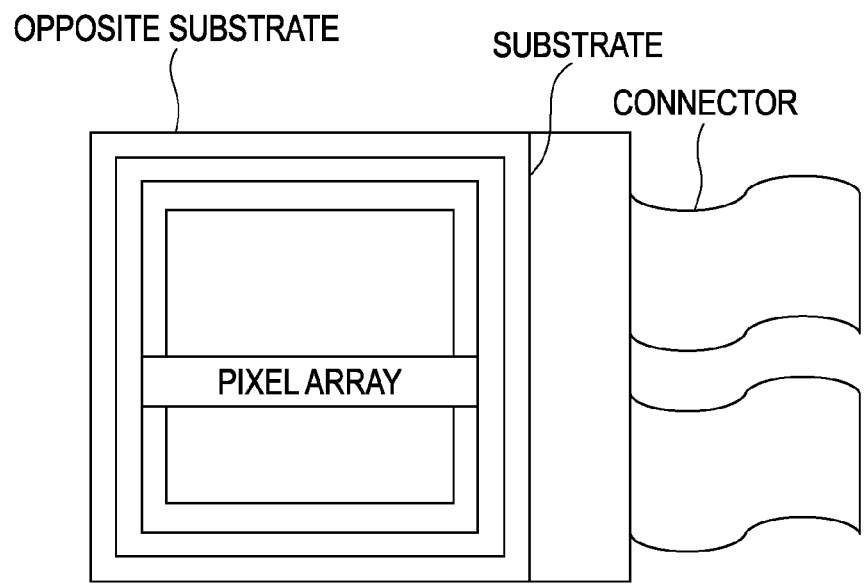
FIG. 20 is a plan view illustrating a module structure of the display apparatus according to an embodiment of the present invention.

The display apparatus according to the present invention may be realized in a flat module form as shown in FIG. 20. More specifically, for example, a pixel array including a plurality of pixels each having an organic electroluminescent element, thin-film transistors, a thin-film capacitor is formed on an insulating substrate, and an opposite substrate made of glass or the like is bonded to the insulating substrate via an adhesive disposed around the pixel array thereby forming a display module. As required, additional parts such as a color filter, a protective film, a light blocking film, etc. may be disposed on the transparent opposite substrate. An FPC (flexible printed circuit) for a connection between the pixel array and an external circuit may be disposed on the display module.

The display apparatus in the form of a flat panel according to the present invention may be used as a display for displaying a still or moving image in various kinds of electronic devices such as a digital camera, a notebook personal computer, a portable telephone, or a video camera. Some specific examples of such electronic devices are shown below.

Figure 21:
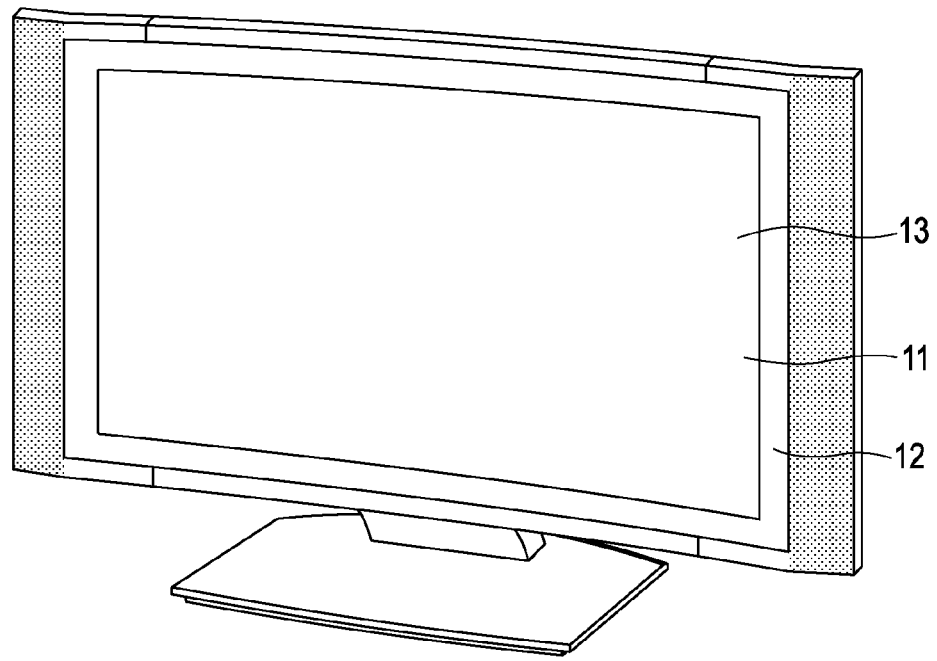
FIG. 21 is a perspective view of a television set using a display apparatus according to an embodiment of the present invention.

FIG. 21 illustrates a television set using an image display screen 11 including a front panel 12 and filter glass 13. The display apparatus according to the present invention may be used as the image display screen 11.

Figure 22:
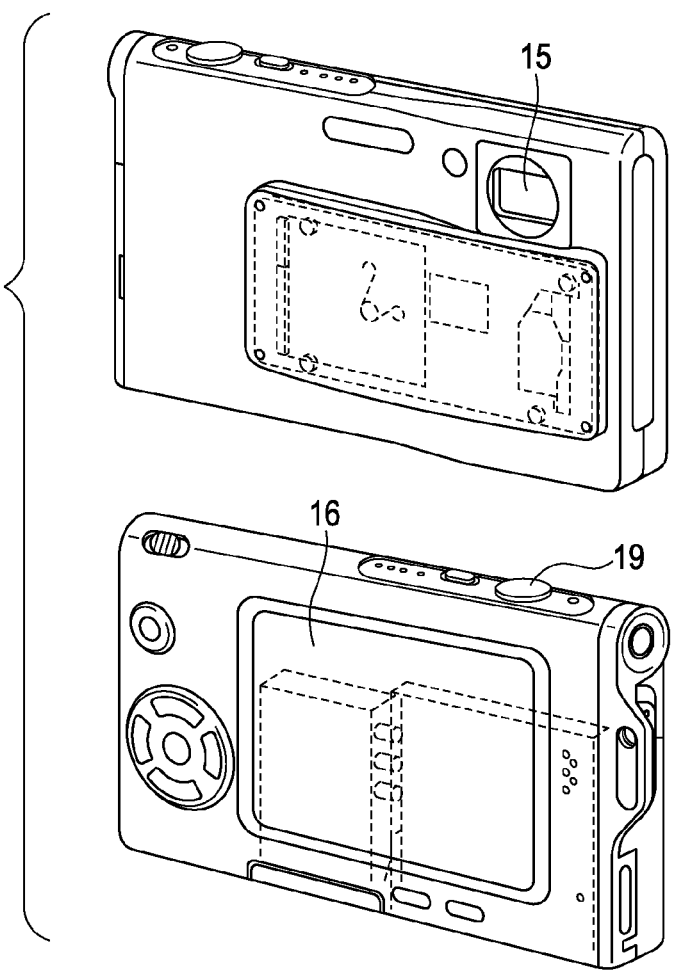
FIG. 22 is a perspective view of a digital still camera using a display apparatus according to an embodiment of the present invention.

FIG. 22 illustrates a digital camera. A front view thereof is shown on the top of the figure, and a rear view is shown on the bottom. The digital camera includes an imaging lens, a flash unit 15, a display 16, a control switch, a menu switch, and a shutter button 19. The display apparatus according to the present invention may be used as the display 16.

Figure 23:
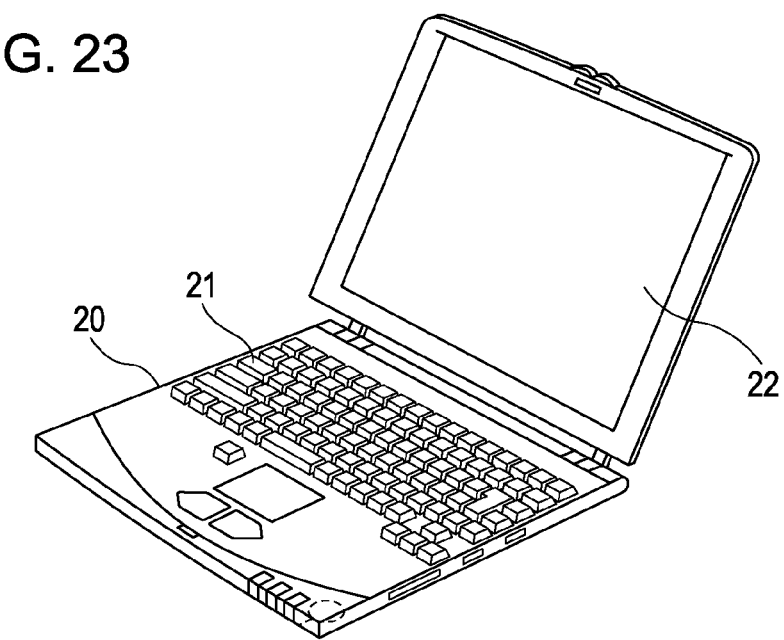
FIG. 23 is a perspective view of a notebook personal computer using a display apparatus according to an embodiment of the present invention.

FIG. 23 illustrates a notebook personal computer. A main body 20 thereof includes a keyboard 21 operated by a user to input data or a command. A cover includes a display 22 for displaying image. The display apparatus according to the present invention may be used as the display 22.

Figure 24:
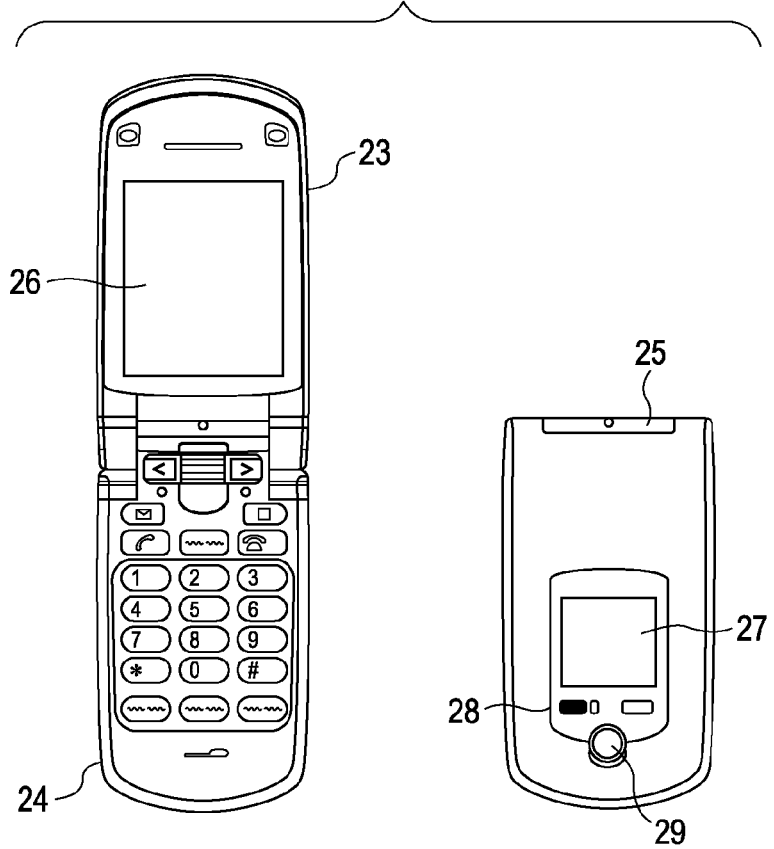
FIG. 24 is a schematic diagram of a portable terminal using a display apparatus according to an embodiment of the present invention.

FIG. 24 illustrates a portable terminal. The portable terminal in an open state is shown on the left-hand side of the figure, while the portable terminal in a closed state is shown in the right-hand side. The portable terminal includes an upper case 23, a lower case 24, a connecting part (hinge) 25, a display 26, a sub-display 27, a picture light 28, and a camera 29. The display apparatus according to the present invention may be used as the display 26 or the sub-display 27.

Figure 25:
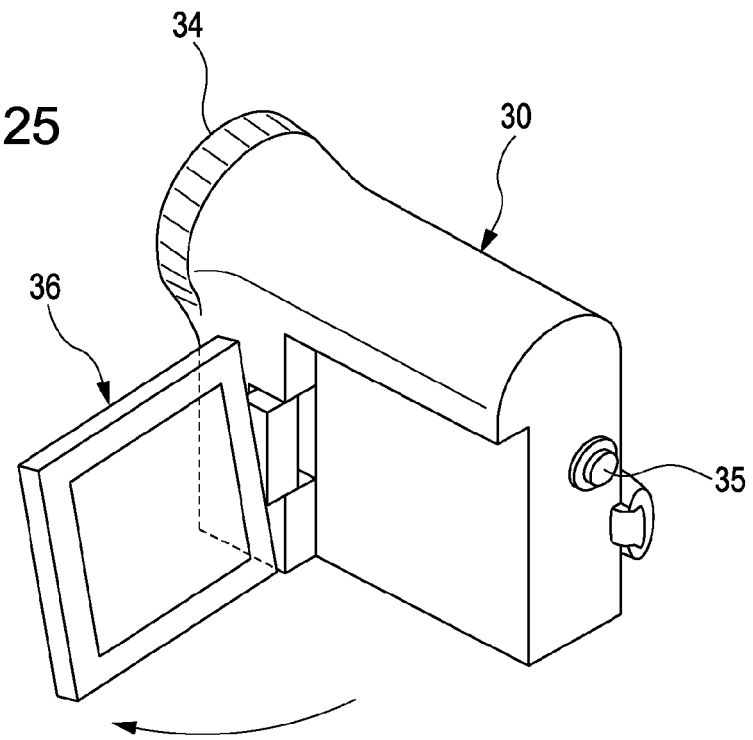
FIG. 25 is a perspective view of a video camera using a display apparatus according to an embodiment of the present invention.

FIG. 25 illustrates a video camera including a main body 30, an imaging lens 34 disposed on a front surface, a start/stop switch 35, and a monitor 36. The display apparatus according to the present invention may be used as the monitor 36.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus comprising:
    a plurality of pixels; and
    a driving unit adapted to drive the plurality of pixels,
    each of the plurality of pixels including at least a sampling transistor, a driving transistor, a light emitting element, a first storage capacitor, a second storage capacitor, a first switching transistor, and a second switching transistor
    the driving unit being configured to output a control signal to turn on the sampling transistor, and output an image signal to write the image signal in the first storage capacitor via the turned-on sampling transistor,
    the driving transistor being configured to supply a driving current, depending on a signal voltage of the written image signal, to the light emitting element during a predetermined light emission period,
    the first switching transistor being connected between a voltage line and the driving transistor, the second switching transistor being connected between the driving transistor and the light emitting element, the second switching transistor being adapted to turn off during a non-light emission period.

2. The display apparatus according to claim 1, wherein
    a gate of the driving transistor is connected to a first reference potential, and a source of the driving transistor is connected to a second reference potential, and
    a threshold voltage of the driving transistor Vth, the first reference potential Vss1, and the second reference potential Vss2 are set to satisfy the following formula $Vss1-Vss2 >= Vth$.

3. The display apparatus according to claim 2, wherein
    the threshold voltage of the light emitting element EL is denoted by VthEL, and parameters are set such that VthEL>Vss2 is satisfied.

4. The display apparatus according to claim 1, further including scanning lines each connected to the respective sampling transistors of ones of the plurality of pixels, and additional scanning lines extending parallel to the scanning lines.

5. The display apparatus according to claim 4, wherein
    the additional scanning lines are sequentially scanned line by line.

6. The display apparatus according to claim 1, wherein
    the second storage capacitor is connected between the source of the driving transistor and a ground line.

7. The display apparatus according to claim 1, wherein
    the transistors and the capacitor are formed on the substrate, and the light emitting element is formed on the transistors and the capacitor.

8. The display apparatus according to claim 7, wherein
    an opposite substrate is disposed on the light emitting element, and the opposite substrate is bonded to the substrate via an adhesive.

9. The display apparatus according to claim 8, wherein
    a color filter is disposed on the opposite substrate.

10. The display apparatus according to claim 1, wherein the second switching transistor, when turned off, prevents a current from the driving transistor to the light emitting element while a correction voltage is written in the first storage capacitor.

11. An electronic device comprising:
    a display panel including:
        a plurality of pixels, and
        a driving unit adapted to drive the plurality of pixels;

at least one circuit board that is not integrated with the display panel; and at least one flexible printed circuit that connects the driving unit to the at least one circuit board and through which an image signal is input to the driving unit, each of the plurality of pixels including at least a sampling transistor, a driving transistor, a light emitting element, a first storage capacitor, a second storage capacitor, a first switching transistor, and a second switching transistor the driving unit being configured to output a control signal to turn on the sampling transistor, and output an image signal to write the image signal in the first storage capacitor via the turned-on sampling transistor, the driving transistor being configured to supply a driving current, depending on a signal voltage of the written image signal, to the light emitting element during a predetermined light emission period, the first switching transistor being connected between a voltage line and the driving transistor, the second switching transistor being connected between the driving transistor and the light emitting element, the second switching transistor being adapted to turn off during a non-light emission period.

12. A display apparatus comprising:

a plurality of pixels; and a driving unit adapted to drive the plurality of pixels, each of the plurality of pixels including at least a sampling transistor, a driving transistor, a light emitting element, a first storage capacitor, a second storage capacitor, a first switching transistor, and a second switching transistor, the driving unit being configured to output a control signal to turn on the sampling transistor, and output an image signal to write the image signal in the first storage capacitor via the turned-on sampling transistor, the driving transistor being configured to supply a correction current to the first storage capacitor and the second storage capacitor during a correction period before a light emission period, and supply a emission current to the light emitting element during the light emission period, the first switching transistor being connected between a voltage line and the driving transistor, the second switching transistor being connected between the driving transistor and the light emitting element, the second switching transistor being adapted to turn off during the correction period.

13. The display apparatus according to claim 12, wherein a gate of the driving transistor is connected to a first reference potential, and a source of the driving transistor is connected to a second reference potential, and a threshold voltage of the driving transistor Vth, the first reference potential Vss1, and the second reference potential Vss2 are set to satisfy the following formula $Vss1 - Vss2 >= Vth$.

14. The display apparatus according to claim 13, wherein the threshold voltage of the light emitting element EL is denoted by VthEL, and parameters are set such that VthEL>Vss2 is satisfied.

15. The display apparatus according to claim 12, wherein further including scanning lines each connected to the respective sampling transistors of ones of the plurality of pixels, and additional scanning lines extending parallel to the scanning lines.

16. The display apparatus according to claim 15, wherein the additional scanning lines are sequentially scanned line by line.

17. The display apparatus according to claim 12, wherein the second storage capacitor is connected between the source of the driving transistor and a ground line.

18. The display apparatus according to claim 12, wherein the transistors and the capacitor are formed on the substrate, and the light emitting element is formed on the transistors and the capacitor.

19. The display apparatus according to claim 18, wherein an opposite substrate is disposed on the light emitting element, and the opposite substrate is bonded to the substrate via an adhesive.

20. The display apparatus according to claim 19, wherein a color filter is disposed on the opposite substrate.

21. The display apparatus according to claim 12, wherein the second switching transistor, when turned off, prevents a current from the driving transistor to the light emitting element while a correction voltage is written in the storage capacitor.

22. An electronic device comprising:

a display panel including:
    a plurality of pixels, and
    a driving unit adapted to drive the plurality of pixels;

at least one circuit board that is not integrated with the display panel; and at least one flexible printed circuit that connects the driving unit to the at least one circuit board and through which an image signal is input to the driving unit, each of the plurality of pixels including at least a sampling transistor, a driving transistor, a light emitting element, a first storage capacitor, a second storage capacitor, a first switching transistor, and a second switching transistor, the driving unit being configured to output a control signal to turn on the sampling transistor, and output an image signal to write the image signal in the first storage capacitor via the turned-on sampling transistor, the driving transistor being configured to supply a correction current to the first storage capacitor and the second storage capacitor during a correction period before a light emission period, and supply a emission current to the light emitting element during the light emission period, the first switching transistor being connected between a voltage line and the driving transistor, the second switching transistor being connected between the driving transistor and the light emitting element, the second switching transistor being adapted to turn off during the correction period.

* * * * *